United States Patent [19]

Satoh et al.

[11] Patent Number: 5,319,324
[45] Date of Patent: Jun. 7, 1994

[54] METHOD OF DIRECT BONDING OF CRYSTALS AND CRYSTAL DEVICES

[75] Inventors: Yuki Satoh, Neyagawa; Koji Hashimoto; Toshio Ishizaki, both of Kobe, all of Japan

[73] Assignee: Matsushita Electric Industrial Co., Ltd., Kadoma, Japan

[21] Appl. No.: 955,256

[22] Filed: Oct. 1, 1992

[30] Foreign Application Priority Data

| Oct. 2, 1991 | [JP] | Japan | 3-255038 |
| Oct. 2, 1991 | [JP] | Japan | 3-255047 |
| Oct. 2, 1991 | [JP] | Japan | 3-255052 |
| Mar. 2, 1992 | [JP] | Japan | 4-044772 |
| May 6, 1992 | [JP] | Japan | 4-113526 |

[51] Int. Cl.⁵ .................. H01L 41/04; H01L 41/107; H03B 5/32; H03H 9/54
[52] U.S. Cl. .................. 331/158; 331/162; 331/163; 331/176; 29/25.35; 310/315; 310/318; 310/320; 310/366; 333/187; 333/189
[58] Field of Search ............. 331/66, 116 R, 116 FE, 331/158, 162, 163, 173; 310/311, 312, 315, 318, 320, 360, 365, 366, 367, 368, 369, 370, 371; 333/187, 189; 29/25.35

[56] References Cited

U.S. PATENT DOCUMENTS 4,503,350  3/1985  Nakatani .................. 310/368 X

FOREIGN PATENT DOCUMENTS 54-53888  4/1979  Japan .
55-138914  10/1980  Japan .
55-158718  12/1980  Japan .
57-52213  3/1982  Japan .

OTHER PUBLICATIONS

"Proceedings of the 39th Annual Symposium on Frequency Control 1985", May 29-31, 1985, R. D. Smythe et al., IEEE, pp. 481-485.

*Primary Examiner*—David Mis
*Attorney, Agent, or Firm*—Wenderoth, Lind & Ponack

[57] ABSTRACT

A method of directly bonding a crystal to a crystal includes the steps of mirror-polishing the surfaces of the crystals and then rinsing them with a cleaning material and then affecting a baking operation and then bonding them together and thereafter annealing them within a temperature range where crystal crystallization is not transited in phase so that a further strong bonding force is obtained. A crystal resonator is obtained where electrodes are oppositely established across a ply crystal blank with at least two sheets of crystal blanks having a desired cut angle and a desired thickness being directly bonded so that the respective crystal axes intersect at the desired angles. The ply crystal blank may have a central portion which is either thicker or thinner than a surrounding portion. A crystal oscillator including a crystal resonator having the above noted features may be fabricated and a temperature compensated crystal oscillator of either the analog or digital type may also be formed using such a crystal resonator. A crystal filter may also be formed using a ply crystal bank with at least two sheets of crystal blanks having a desired cut angle and a desired shape being directly bonded so that respective crystal axes intersect at the desired angles.

17 Claims, 15 Drawing Sheets

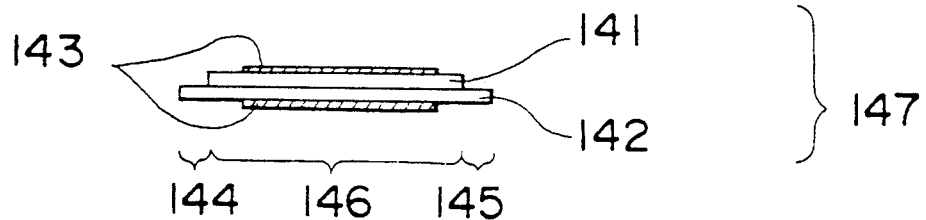
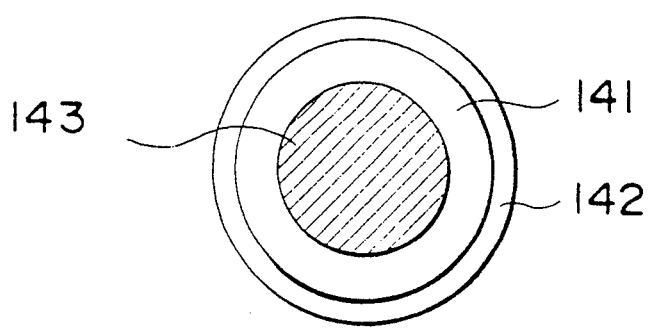
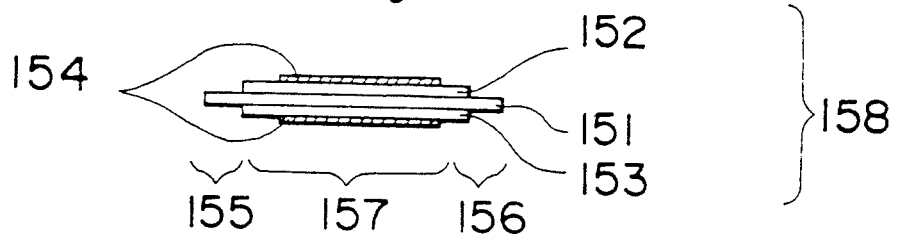
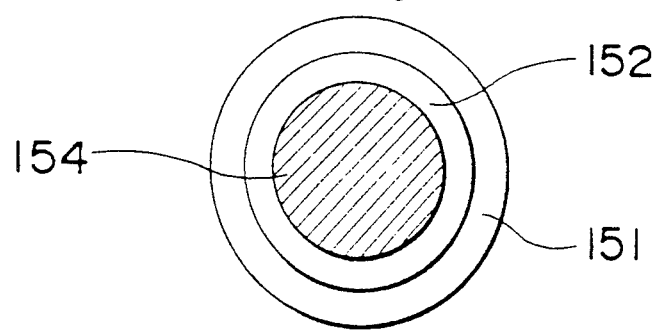

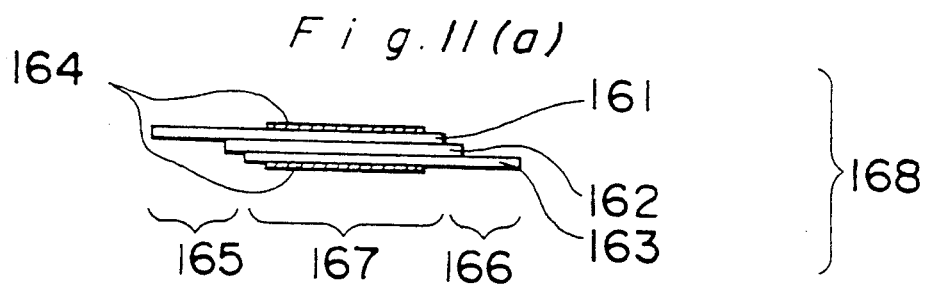
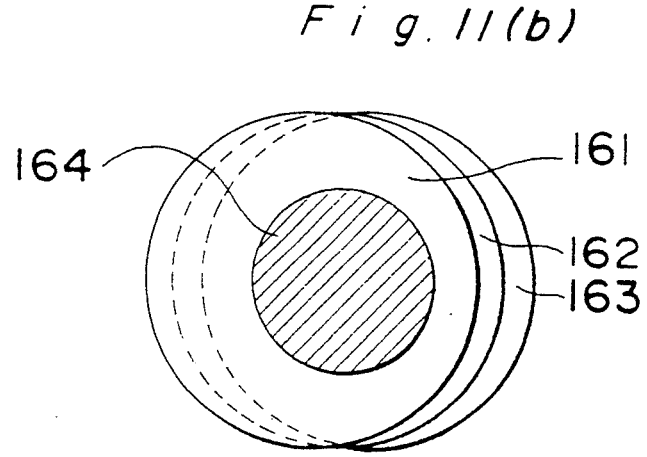
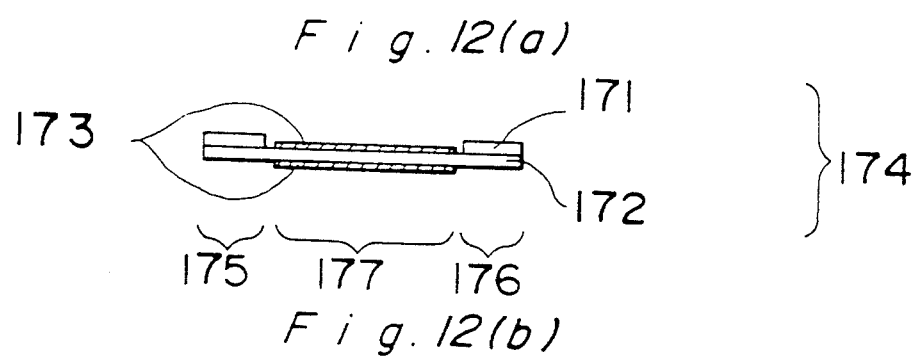
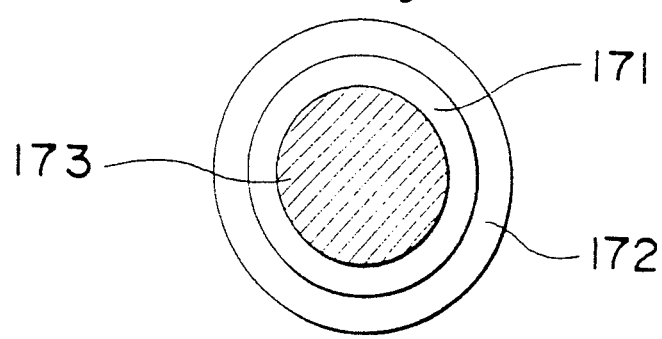

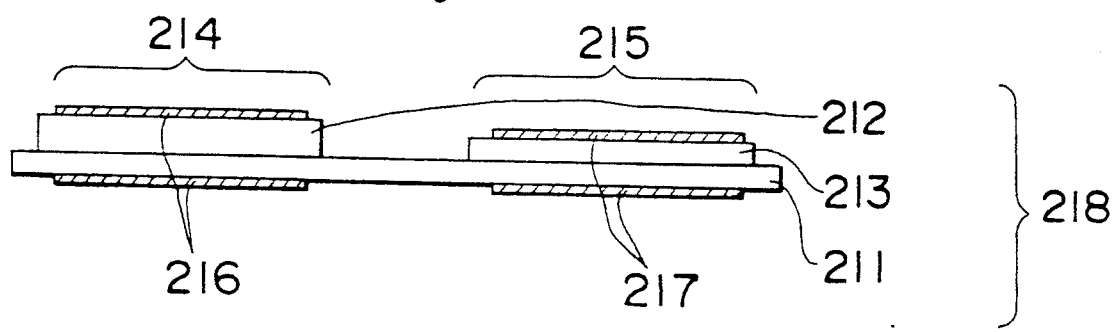
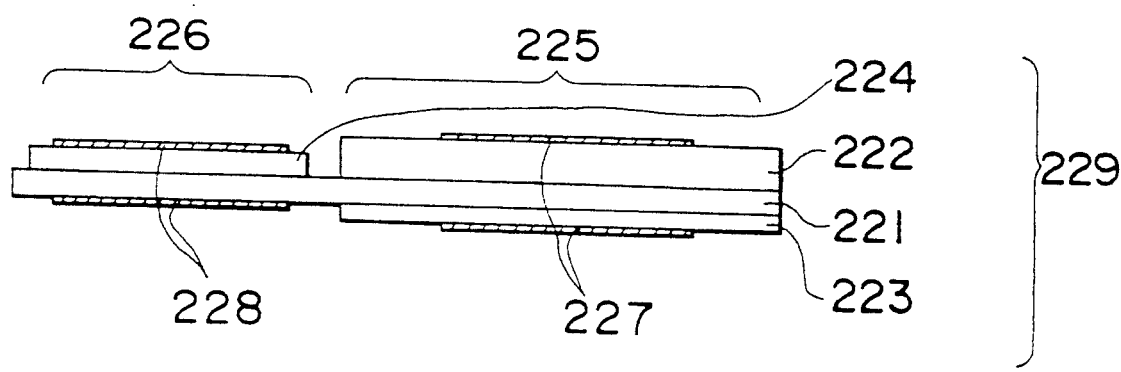
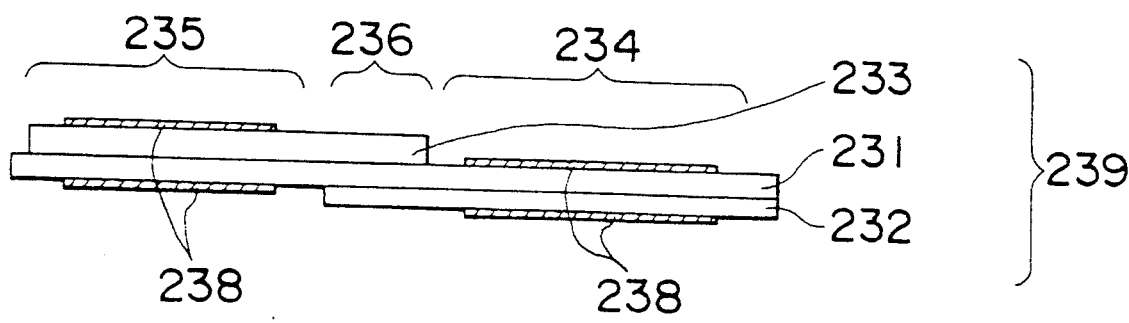

METHOD OF DIRECT BONDING OF CRYSTALS AND CRYSTAL DEVICES

BACKGROUND OF THE INVENTION

The present invention generally relates to a method of directly bonding a crystal to a crystal without the interposition of a bonding agent, and to a crystal device which can be used in a mobile communication device such as portable telephone or the like.

The conventional crystal resonator is constructed so that electrodes are oppositely established through crystal blanks worked into a disk shape and a lens shape by mechanical and chemical working methods. Conventionally a crystal resonator to be used in a mobile communication device is called an AT cut crystal resonator whose resonance mode is a thickness shear mode. The resonant frequency of the AT cut crystal resonator is determined by the thickness and elastic constant of the crystal blank. Also, the resonant frequency-temperature characteristics are determined by its cut angle, and shows a tertiary curve. A frequency stability of $\pm 1.0$ ppm is obtained in the temperature range of 0° through 50° C. (see, for example, 'Piezo-electricity'; edited by Walter Guyton CADY, Dover Publ., Inc.) by the control of the cut angle. A method (see Japanese Laid-Open Patent Publication No. 55-138914) of causing a material of a different line expansion coefficient on a crystal basic plate or engaging it (see Japanese Laid-Open Patent Publication Nos. 55-158718 and 56-61899) is proposed as a method of increasing the frequency stability.

A crystal piece is shaped (convex) so that its central portion may become thicker than the environment portion like an optical lens as shown. A Q value is increased with the elastic vibrations being contained within the central portion when the central portion of the electrode is made thicker (see, for example, Japanese Laid-Open Patent Publication No. 2-260910).

A method of partially thinning the crystal blank by a chemical etching method, a method of using a fundamental mode and a overtone mode at the same time, or other methods have been considered as methods of outputting a plurality of vibrations from one crystal resonator.

The crystal oscillator is an oscillator designed to stabilize frequencies using crystal oscillator and having a Q of approximately 100,000. Therefore, the output frequency-temperature characteristics of the crystal oscillator depend upon the resonant frequency-temperature characteristics of the crystal oscillator. When the conventional AT cut crystal resonator is used, the frequency stability of $\pm 1.0$ ppm is obtained in the temperature range of 0° through 50° C. A frequency stability of $\pm 1.0$ ppm at $-30°$ C. through 80° C. is demanded of a crystal oscillator to be used in a portable telephone. A temperature compensating circuit is required so as to satisfy this demand. A crystal oscillator with a temperature compensating circuit being provided in it is called a temperature compensated crystal oscillator whose type can be chiefly divided into analog systems and digital systems.

The conventional analog temperature compensated crystal oscillator is composed of temperature sensing elements such as a thermistor, capacitor elements such as capacitors, varactor diodes, and resistors so as to compensate for changes due to temperature of the reactance (resonant frequency) of the crystal resonator with the reactance of the temperature compensating circuit being changed for stabilizing the output frequency.

The conventional digital temperature compensated crystal oscillator is stabilized by data stored in advance by the corresponding operation of the output frequency of the digital control crystal oscillator composed of a variable reactance circuit, an oscillating circuit and a crystal oscillator. A method of outputting fundamental frequencies and higher order overtones or spurious overtones with one crystal blank sheet so as to suppress the temperature difference caused by the difference in location between the temperature sensor and the crystal oscillator, and the difference in the thermal time constant (see, for example, Japanese Laid-Open Patent Publication No. 2-170607 and Japanese Laid-Open Patent Publication No. 2-174407).

The conventional crystal filter has two sets of opposite electrodes adjacently formed onto both faces of the crystal blank. One set is an input electrode and the other set is an output electrode. When an electrical signal is inputted into an input electrode, the elastic vibration of the resonant frequency is excited into a crystal blank in a region where the input electrode is formed. The elastic vibrations are propagated into the crystal blank and reach a region where the output electrode is formed. As a result, an electric field is caused in a region where the output electrode is formed, and the electrical signals are output from the output electrode. Namely, the filter becomes a band-pass filter of a resonant frequency to be determined by the thickness of the crystal blank and the elastic constant thereof (see, for example, Proc. 39th Ann. Frequency Control symposium, pp. 481 –485 'VHF MONOLITHIC CRYSTAL FILTERS FABRICATED BY CHEMICAL MILLING').

A three-dimensional processing is hard to effect in only the processing of the crystal blank simply by such mechanical and chemical polishing operations as described hereinabove, with a problem that the processing time is long.

There is a restriction in improvements of stability of the crystal resonator only by adjusting a cut angle. These materials become resistors which interfere with the elastic vibrations of the crystal in a method of using a different material on the crystal basic plate or engaging it, with a problem that the Q of the crystal resonator is deteriorated.

A method of convexly processing the crystal blank as a method of increasing the Q has problems in that the accuracy of the resonant frequency is lowered. A method of evaporating electrode films many times such that each film has a different size has problems in that more time is required.

A method of outputting two vibrations using a fundamental mode and a overtone mode of one crystal blank sheet cannot separately set the respective resonant frequencies and the temperature characteristics.

Separate compensating circuits are required for high temperature use and a low temperature use in an analog temperature compensated crystal oscillator using a thermistor or the like, with a problem in that the number of circuit parts is increased, and an adjusting operation becomes complicated, thus resulting in a higher cost.

The digital temperature compensated crystal oscillator is provided with separate crystal resonators for temperature sensor and oscillation use. Proper temperature compensation cannot be effected if the temperature difference caused by the difference in the thermal time constant between them, the difference in their location and so on are not suppressed, and large capacity memories are required, and adjusting costs become higher. A method of outputting the fundamental modes, higher order overtones or spurious modes with one crystal resonator sheet becomes respectively essential to excite, across the wide temperature ranges, independently, selectively and stably so as to suppress the temperature difference between the temperature sensor and the crystal resonator. Therefore, the designing of the crystal vibrator, the bias of the oscillating circuit and the feedback capacitor must be carefully determined. The bias and the feedback capacitor of the oscillation circuit must be temperature compensated as the case may be, with problems in that the circuit scale is too large and disordered to be fabricated.

The crystal filter has problems in that the stability of the frequency-temperature characteristics are lower, and it is difficult for the size to be made smaller because of its plane construction.

SUMMARY OF THE INVENTION

Accordingly, the present invention has been developed with a view to substantially eliminating the above discussed drawbacks inherent in the prior art, and has for its essential object to provide a method of directly bonding crystals, and a crystal device.

Another important object of the present invention is to provide a method of directly bonding a crystal to a crystal without the interposition of a bonding agent, a crystal resonator with the resonant frequency-temperature characteristics being superior than before, a crystal resonator where increasing the Q can be easily effected, a crystal resonator capable of outputting a plurality of vibrations having optional resonant frequency and the temperature characteristics in simple substance, a crystal oscillator superior in oscillation frequency-temperature characteristics, an analog temperature compensated crystal oscillator and a digital temperature compensated crystal oscillator wherein temperature compensation of a higher accuracy may be effected with the number of the parts being fewer, the size being smaller, and the price being lower, a crystal filter with frequency-temperature characteristics being stable and a crystal filter which is smaller in size.

In accomplishing these and other objects, there is provided a method of directly bonding a crystal to a crystal, which includes the steps of mirror-polishing the surfaces, rinsing them with a cleaning material, thereafter rinsing them with isopropyl alcohol and rinsing them with a mixed sulfuric acid and hydrogen peroxide solution, or effecting rinsing and drying operations using isopropyl alcohol, or rinsing them with isopropyl alcohol and rinsing them with hydrogen water fluoride or ammonia water fluoride, then effecting a baking operation, contacting without interpositions the crystal blanks so that the above described surfaces may become smooth, flat and may be terminated with a hydroxyl group, effecting an annealing processing operation within the temperature range where the crystal crystallization may not be transited in phase so that further strong bonding force may be obtained after the bonding operation is effected with a bonding force to be applied between the above described hydroxyl groups on the above described surfaces.

The crystal resonator is adapted to oppositely set the electrodes through a ply crystal piece where at least two crystal blank sheets having a desired cut angle and a desired thickness are directly bonded so that the respective crystal axes may intersect at desired angles.

The crystal oscillator, analog temperature compensated crystal oscillator and digital temperature compensated crystal oscillator of the present invention are provided with a crystal resonator, which oppositely sets the electrodes through a ply crystal piece where at least two sheets of crystal blanks having a desired cutting angle and a desired thickness are directly connected so that the respective crystal axes may intersect at desired angles. The digital temperature compensated crystal oscillator of the present invention is provided with a crystal resonator integrated with a first and a second vibrating portions which directly bond at least two sheets of crystal blanks having the desired cut angle and the given desired thickness so that the respective crystal axes intersect with a desired angle so as to constitute a ply crystal piece having at least two different thicknesses, and oppositely set two sets of electrodes through the desired thickness of the above described ply crystal blanks.

The crystal filter of the present invention is adapted to have at least two sets of opposite electrodes through a ply crystal blank directly bonded where at least two sheets of crystal blanks having the desired cut angle and the desired thickness are directly bonded so that the respective crystal axes may intersect at a desired angle or the crystal blank with electrodes being formed on both the faces and at least one crystal blank sheet with an electrode being formed on a single face are superposed so that the above described crystal blank and the above described electrode alternate, and the above described respective crystal blanks are connected to each other directly in a portion where the above described electrode is not interposed.

The present invention of the above described construction can realize a crystal resonator improved in resonant frequency-temperature characteristics and so on by making it possible to effect the direct connection of the crystals, improving a three-dimensional working property through steps of mirror-polishing the surfaces, rinsing them with a cleaning material, thereafter rinsing them with isopropyl alcohol and rinsing them with a mixed sulfuric acid and hydrogen peroxide solution, effecting a baking operation, contacting without interpositions crystal blanks so that the above described surfaces may become smooth, flat and may be terminated with a hydroxyl group, effecting the thermal processing operation within the temperature range where the crystal crystallization may not be transited in phase so that further stronger bonding force may be obtained after the bonding operation with a bonding force to be applied between the above described hydroxyl groups on the above described surfaces so as to improve the three-dimensional working property.

Also, a crystal resonator stable in the resonance frequency in a wide temperature range can be realized by the opposite establishment of the electrodes through the ply crystal blank so that at least two sheets of crystal blanks having a desired cut angle and a desired thickness are directly bonded so that the respective crystal axes intersect at a desired angle.

Also, a crystal resonator higher in a Q value can be realized by the opposite establishment of the electrodes through the central portion of the above described ply crystal blank, where at least two sheets of crystal blanks having a desired cut angle and a desired thickness are directly bonded so that the respective crystal axes intersect at a desired angle so as to construct a ply crystal blank with the thickness of the central portion being different from that of the surrounding portion.

Also, a plurality of vibrating crystal resonators having an optional resonant frequency and temperature characteristic in simple substance can be realized by the opposite establishment of at least two sets of electrodes through the desired thickness of the above described ply crystal blank where at least two sheets of crystal blanks having a desired cut angle and a desired thickness are directly bonded so that the respective crystal axes intersect at a desired angle so as to construct a ply crystal blank having at least two different thicknesses.

Also, a crystal oscillator stable in the output frequency across the wide temperature range, and a temperature compensated crystal oscillator smaller in size, lower in consumption current, higher in accuracy and lower in price can be realized by the use of a crystal resonator with the electrodes being adapted to be oppositely established through a ply crystal blank where at least two sheets of crystal blanks having a desired cut angle and a desired thickness are directly bonded so that their crystal axes intersect at a desired angle.

Also, a high-accurate digital temperature compensated crystal oscillator can be realized by the direct bonding of at least two sheets of crystal blanks having the desired cut angle and the desired thickness so that the respective crystal axes intersect in a desired angle so as to constitute a ply crystal blank having at least two different thicknesses, and two sets of electrodes are oppositely established through the desired thickness of the above described ply crystal blank so as to integrate the first and second vibrating portions to make it possible to integrate the crystal resonators for temperature sensor use and digital control crystal oscillator use so that the temperature difference between the crystal resonators for temperature sensor use and digital control crystal oscillator use is greatly reduced suppressed.

Also, a crystal filter stable in frequency-temperature characteristics can be realized by the construction of at least two sets of opposite electrodes through a ply crystal blank where at least two crystal blanks having the desired cutting angle and the desired thickness are directly bonded so that the respective crystal axes intersect at a desired angle.

Also, a crystal filter smaller in size can be realized where at least two crystal blanks or more and an electrode more by one than the above described crystal blank are alternately superposed and the respective crystal blanks opposite through the respective electrodes are directly coupled at a portion where the electrodes are not interposed.

BRIEF DESCRIPTION OF THE DRAWINGS

These and other objects and features of the present invention will become apparent from the following description taken in conjunction with the preferred embodiment thereof with reference to the accompanying drawings, in which;

FIG. 9 (a) is a side face view of a crystal resonator in accordance with an eighth embodiment of the present invention, and FIG. 9 (b) is a plan view of a crystal resonator in the same embodiment;

FIG. 10 (a) is a side face view of a crystal resonator in accordance with a ninth embodiment of the present invention, and FIG. 10 (b) is a plan view of a crystal resonator in the same embodiment thereof;

Figure 13:
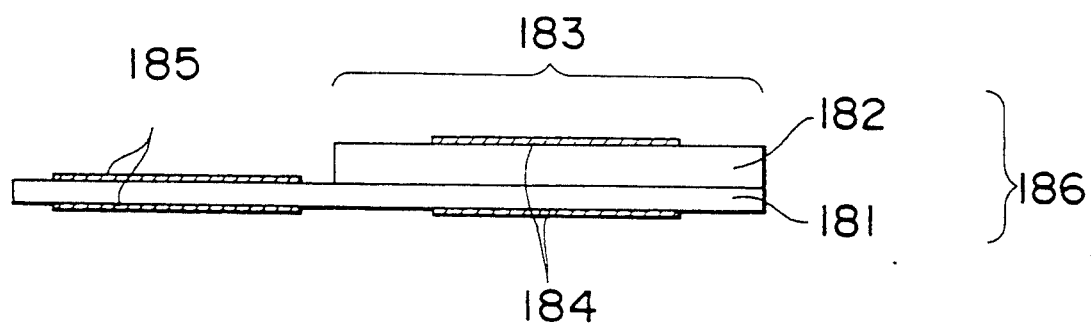
Figure 14:
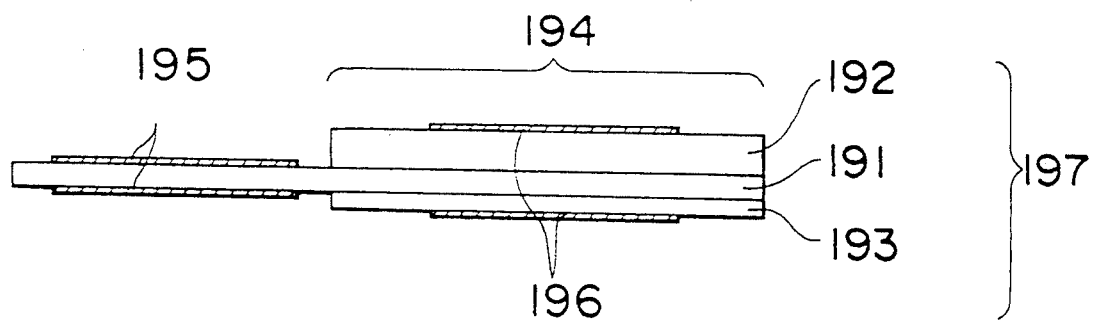
Figure 15:
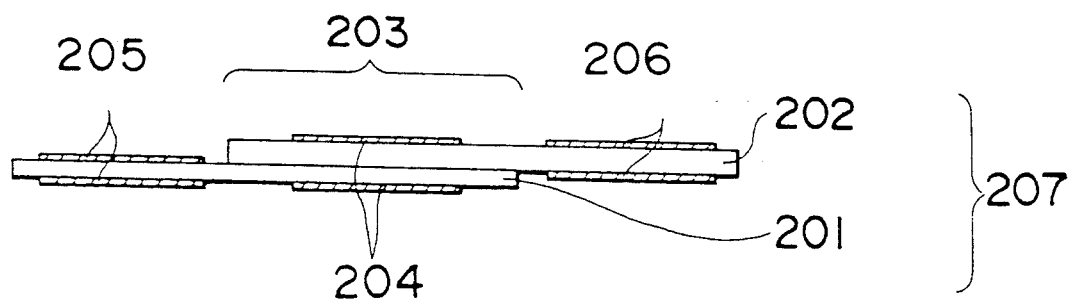
Figure 19:
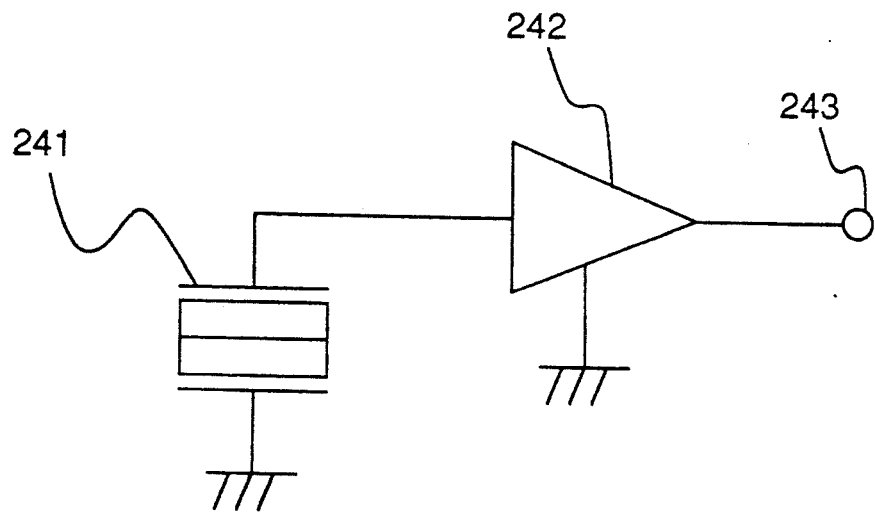
Figure 20:
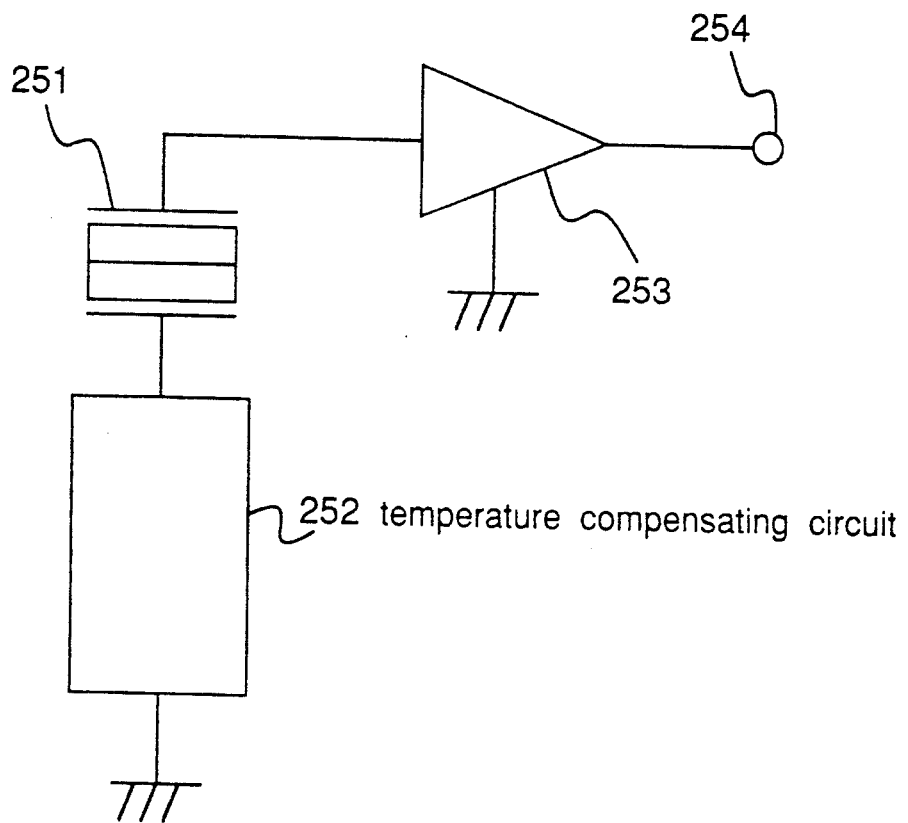
Figure 21:
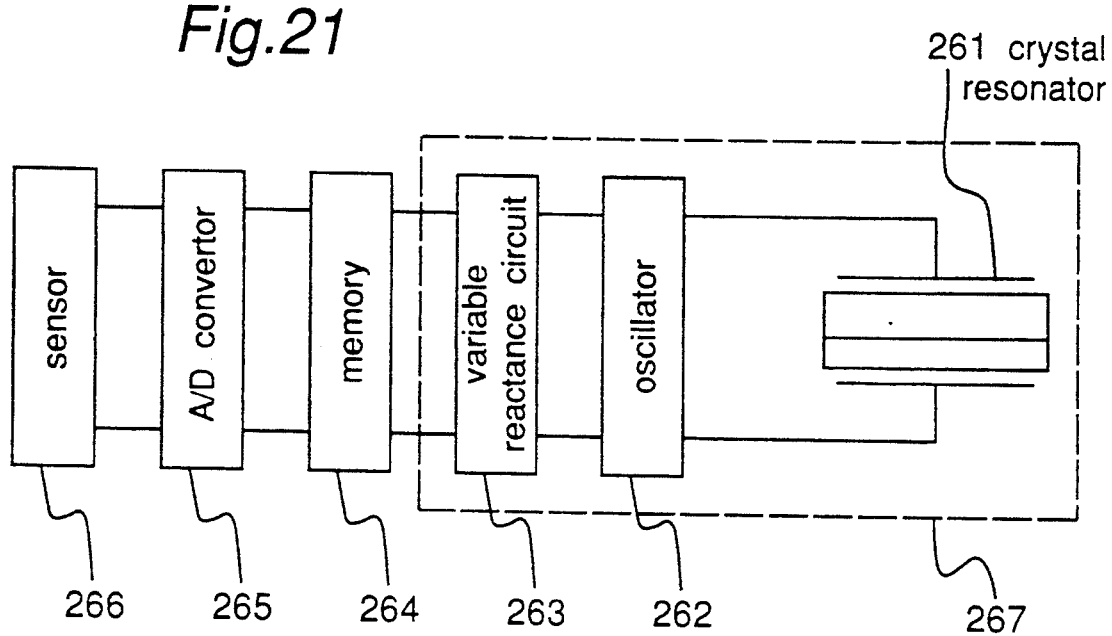
Figure 22:
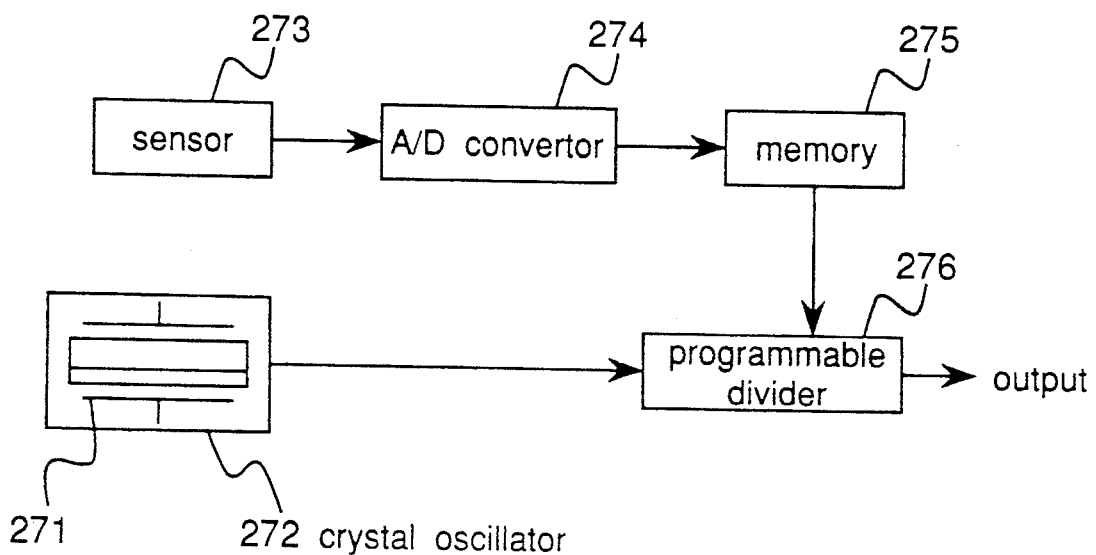
Figure 23:
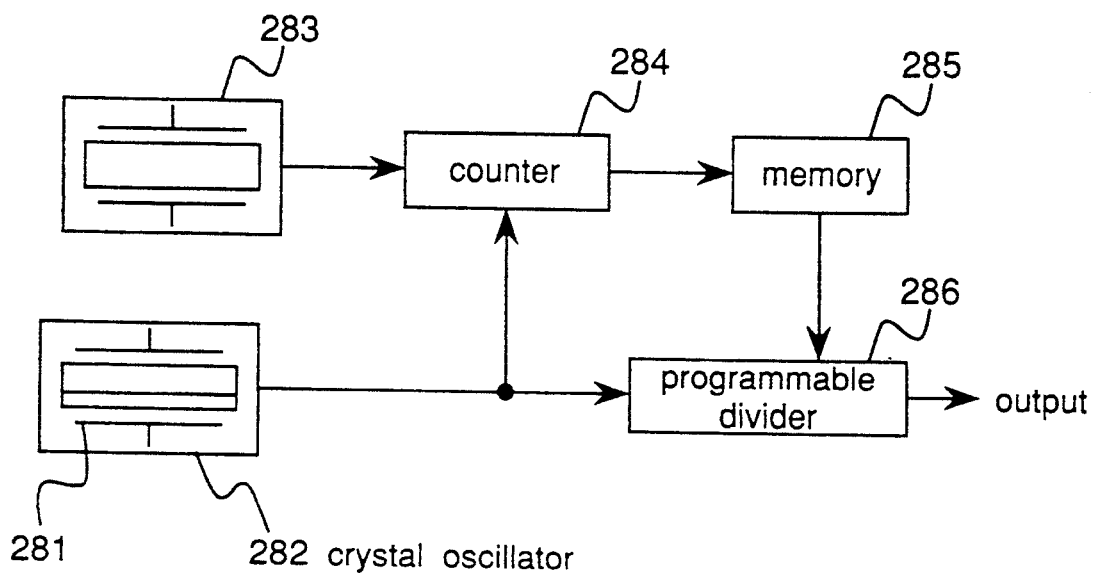
Figure 24:
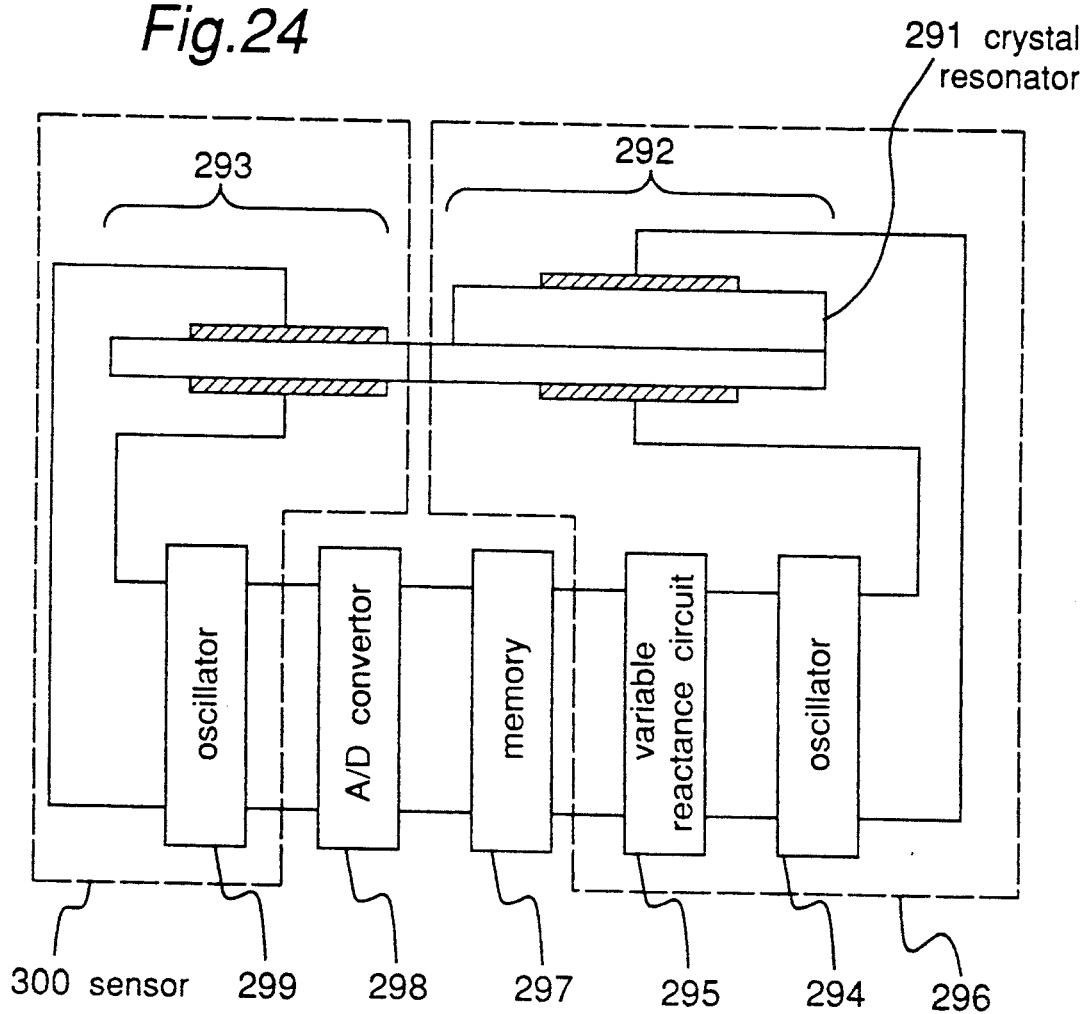
Figure 25:
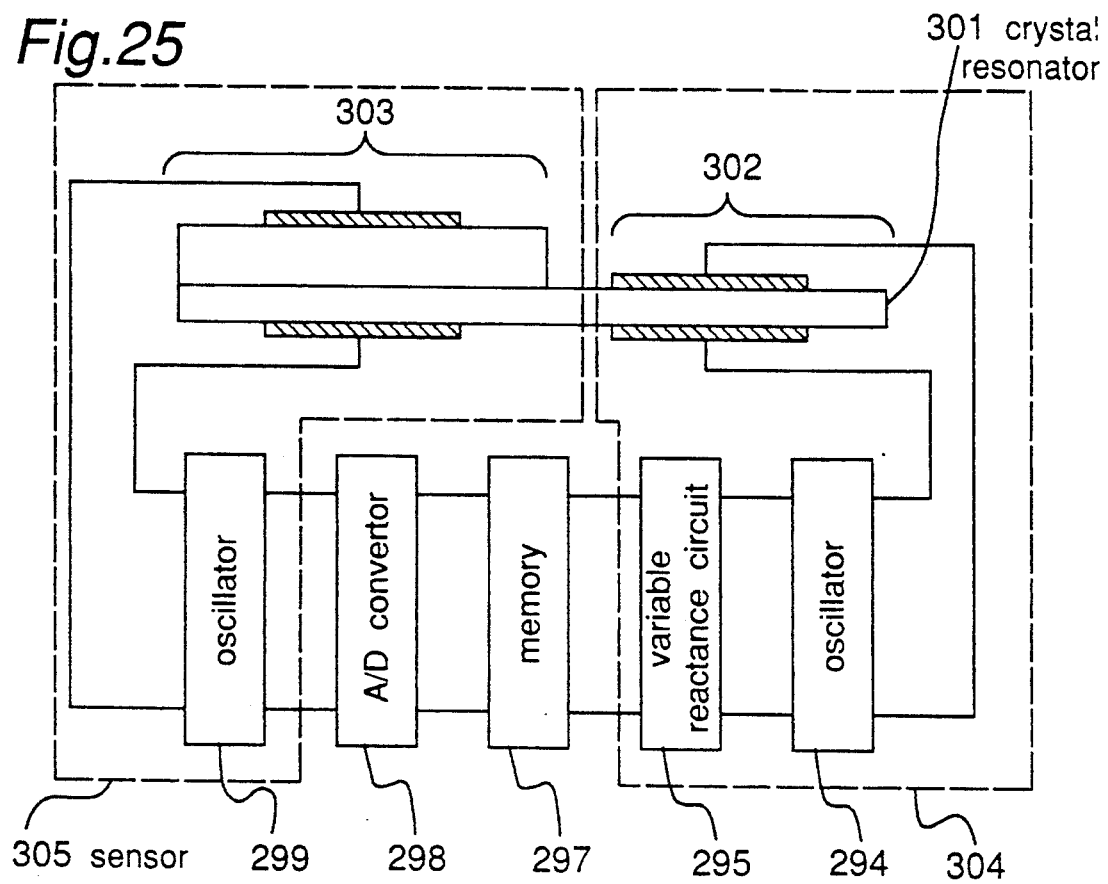
Figure 26:
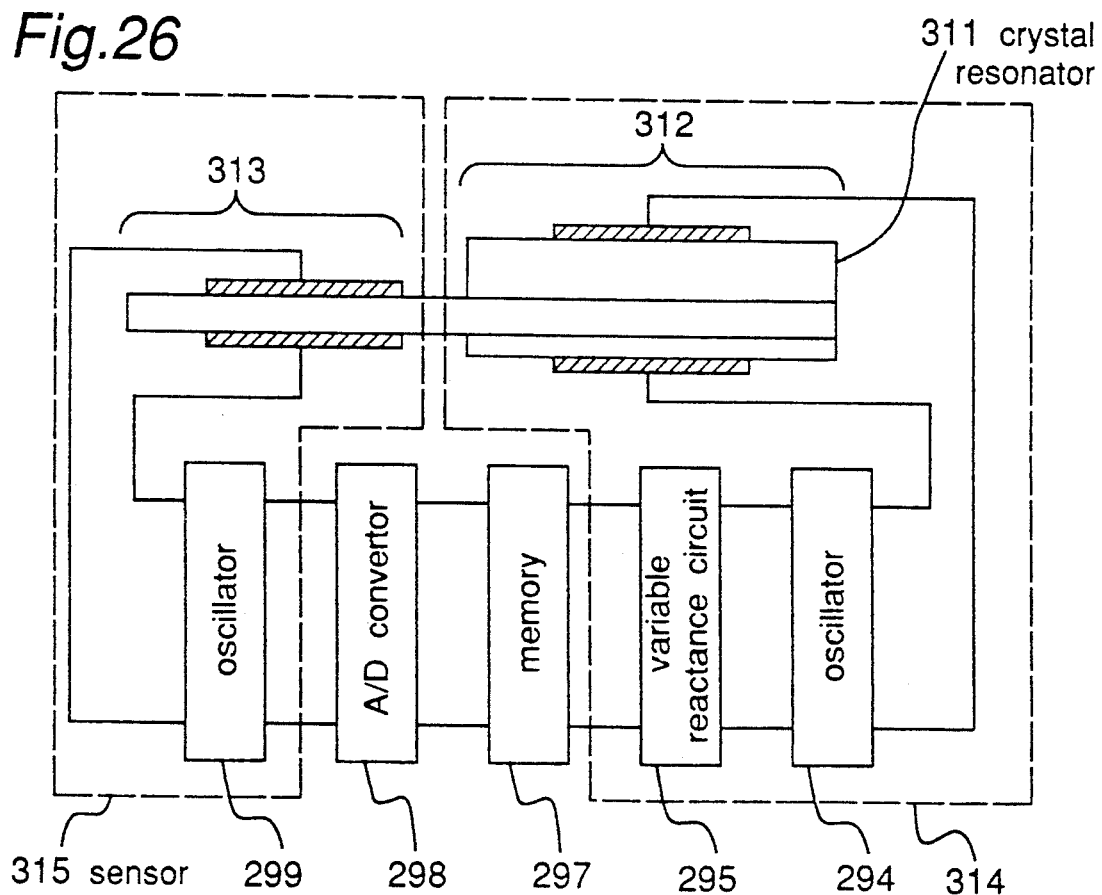
Figure 27:
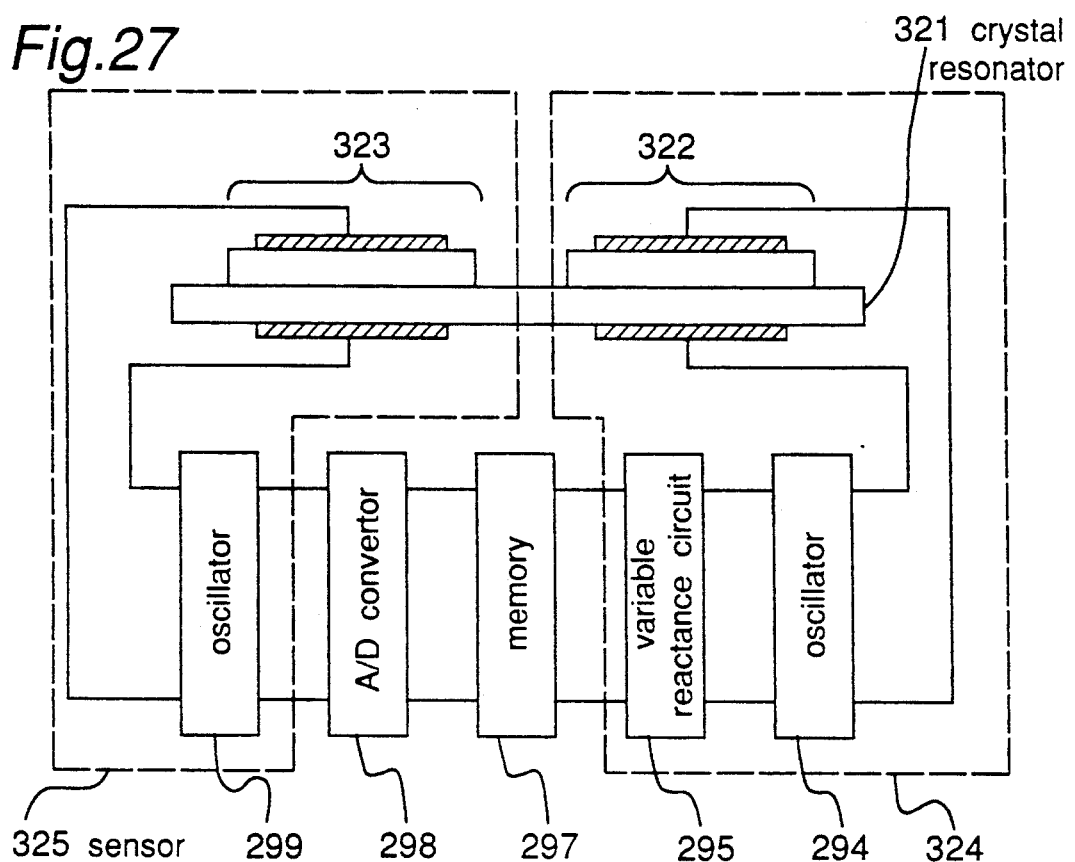
Figure 28:
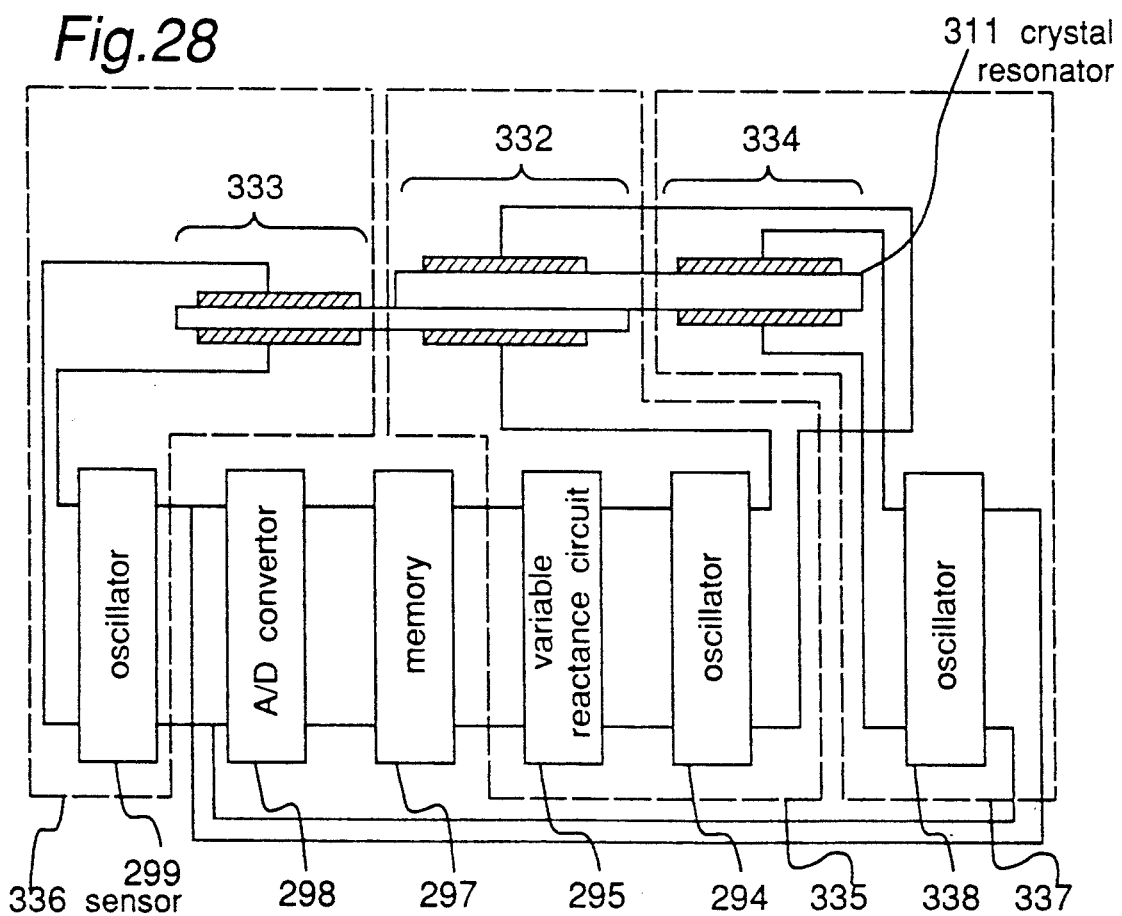

FIG. (a) is a side face view of a crystal resonator accordance with in a tenth embodiment of the present invention, and FIG. 11 (b) is a plan view of a crystal resonator in the same embodiment thereof;

FIG. 12 (a) is a side face view of a crystal resonator in accordance with an eleventh embodiment of the present invention and FIG. 12 (b) is a plan view of a crystal resonator in the same embodiment thereof;

FIG. 13 is a view showing a crystal resonator in accordance with a twelfth embodiment of the present invention;

FIG. 14 is a view showing a crystal resonator in accordance with a thirteenth embodiment of the present invention;

FIG. 15 is a view showing a crystal resonator in accordance with a fourteenth embodiment of the present invention;

FIG. 16 is a view showing a crystal resonator in accordance with a fifteenth embodiment of the present invention;

FIG. 17 is a view showing a crystal resonator in accordance with a sixteenth embodiment of the present invention;

FIG. 18 is a view showing a crystal resonator in accordance with a seventeenth embodiment of the present invention;

FIG. 19 is a view showing a crystal oscillator in accordance with an eighteenth embodiment of the present invention;

FIG. 20 is a view showing an analog temperature compensated crystal oscillator in accordance with a nineteenth embodiment of the present invention;

FIG. 21 is a view showing a digital temperature compensated crystal oscillator in accordance with a twentieth embodiment of the present invention;

FIG. 22 is a view showing a digital temperature compensated crystal oscillator in accordance with a twenty first embodiment of the present invention;

FIG. 23 is a view showing a digital temperature compensated crystal oscillator in accordance with a twenty second embodiment of the present invention;

FIG. 24 is a view showing a digital temperature compensated crystal oscillator in accordance with a twenty third embodiment of the present invention;

FIG. 25 is a view showing a digital temperature compensated crystal oscillator in accordance with a twenty fourth embodiment of the present invention;

FIG. 26 is a view showing a digital temperature compensated crystal oscillator in accordance with a twenty fifth embodiment of the present invention;

FIG. 27 is a view showing a digital temperature compensated crystal oscillator in accordance with a twenty sixth embodiment of the present invention;

FIG. 28 is a view showing digital temperature compensated crystal oscillator in accordance with a twenty seventh embodiment of the present invention;

FIG. 29 (a) is a plan view showing a crystal filter in accordance with a twenty eighth embodiment of the present invention, and FIG. 29 (b) is a side view of FIG. 29 (a);

FIG. 30 (a) is a plan view showing a crystal filter in accordance with a twenty ninth embodiment of the present invention, and FIG. 30 (b) is a side view of FIG. 30 (a);

FIG. 31 (a) is a plan view showing a crystal filter in accordance with a thirtieth embodiment of the present invention, and FIG. 31 (b) is a side view of FIG. 31 (a);

FIG. 32 (a) is a plan view showing a crystal filter in accordance with a thirty first embodiment of the present invention, and.

FIG. 32 (b) is a side view of FIG. 32 (a).

DETAILED DESCRIPTION OF THE INVENTION

Before the description of the present invention proceeds, it is to be noted that like parts are designated by like reference numerals throughout the accompanying drawings.

The first embodiment of the present invention will be described hereinafter with reference to the drawings.

Figure 1:
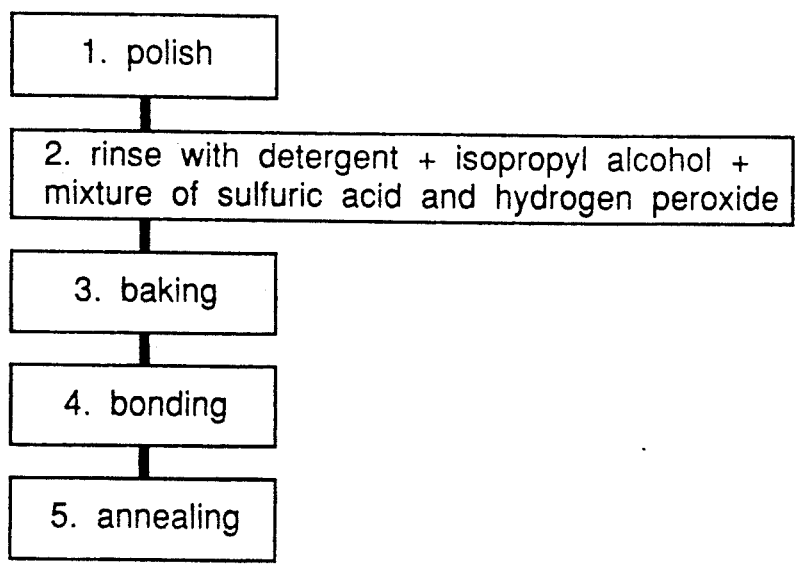
FIG. 1 is a flowchart of a method of directly bonding crystals in accordance with a first embodiment of the present invention.

FIG. 1 is a flowchart of a method of directly bonding crystals in accordance with a first embodiment of the present invention. The bonding processes are: 1) mirror polishing, 2) rinsing, 3) baking, 4) bonding, and 5) annealing.

The present invention will be described hereinafter with reference to the flowchart of FIG. 1.

The surfaces of a plurality of crystal blanks are made smooth and flat with a maximum unevenness of approximately several hundred Angstroms by the mirror face polishing operation. A wet type of scrub rinsing is effected using a cleaning material and a rinsing operation is effected using isopropyl alcohol so as to remove dirt, etching particles and so on accumulated in the mirror face polishing operation. Further, a rinsing operation is effected using a mixed sulfuric acid and hydrogen peroxide solution. In this condition, the crystal surfaces are in a condition where a hydroxyl group is combined with the coupling portion of the dangling crystal surface atom and further these hydroxyl groups are coupled by hydrogen to their surrounding water molecule. A baking operation is effected in a dust free environment so as to remove the water molecules combined by hydrogen to the surfaces of the crystal blank. For example, the blank is retained at 300° C. for one hour. The surface of the crystal blank with the processes provided so far being completed is terminated with a hydroxyl group coupled with the surface atoms of the crystal blank. When crystal blanks in such a surface condition are brought into contact with one another, the hydroxyl group coupled to the surfaces of the single crystal blank is mutually coupled by hydrogen to the hydroxyl group coupled to the surface of the crystal opposite to it across the contact face, so that weak coupling condition at an early stage of the crystal blank processing is obtained without any interposition of bonding agents due to the hydrogen coupling. The crystal blanks coupled to each other at the early stage are thermally processed within the temperature range where the crystal crystallization is not transited in phase with an object of further improving of the mechanical and electrical characteristics. For example, they have only to be heated to 500° C. under the atmospheric pressure. The hydroxyl group which contributed towards the early stage of bonding of the crystal blanks is dehydrated, and condensed by the annealing processing. One portion thereof passes through the coupling field face of the crystal blank and is released outside. The other portion thereof is diffused into the crystal crystallization so as to firmly bond the crystal blanks to each other. In order to obtain a superior direct bonding condition by the prevention of gasification through the separating reaction of the water molecules caused at the later annealing process, the drying operation is effected and the water molecules are removed before the crystal blanks are brought together into contact.

According to the present embodiment as described hereinabove, the crystal blanks can be directly bonded together mechanically and firmly. When elastic vibrations are driven electrically into the directly bonded crystal blanks, the elastic vibrations are continuously propagated on the direct coupling field face and the directly bonded crystal blanks become integral so as to effect elastic vibrations. The resonant frequencies as calculated by numerical equation 1 where the crystal blanks with resonant frequencies of a thickness shear mode has been directly bonded with two sheets can be represented by numerical equation 2. When the same crystal blanks are directly bonded to each other, a resonant frequency is provided which is the same as one sheet of crystal blank having the thickness equal to two sheets of crystal blanks bonded together.

$$f_n = \frac{1}{2t_n} \left( \frac{C_n}{\rho} \right)^{\frac{1}{2}}$$ (Numerical Equation 1)

where $t_n$ ... thickness of crystal blank n
$C_n$ ... elastic constant of crystal blank n
$\rho$ ... density of crystal
$n = 1, 2$ $$\frac{1}{f} = \frac{1}{f_1} + \frac{1}{f_2} + \ldots + \frac{1}{f_m}$$ (Numerical Equation 2)

where m . . . number of crystal blanks directly bonded

As the direct bonding field face does not become a factor interfering with the elastic oscillations, the Q of the directly bonded crystal blank is not deteriorated.

A second embodiment of the present invention will be described hereinafter with reference to the drawings.

Figure 2:
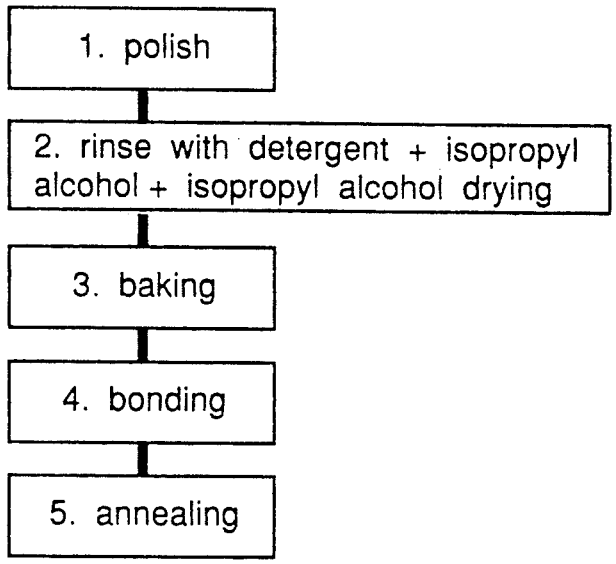
FIG. 2 is a flowchart of a method of directly bonding crystals in accordance with a second embodiment of the present invention.

FIG. 2 is a flowchart of a method of directly bonding crystals in accordance with the second embodiment of the present invention. The bonding process includes: 1) mirror-polishing, 2) rinsing, 3) baking, 4) bonding, and 5) annealing.

The basic process and effect of the second embodiment of the present invention is similar to that of the first embodiment of the present invention. In the second embodiment of the present invention, foreign materials such as dust and so on attached to the crystal surfaces can be reduced after the rinsing operation by drying using isopropyl alcohol as a stand-by baking operation before the baking operation.

A third embodiment of the present invention will be described hereinafter with reference to the drawings.

Figure 3:
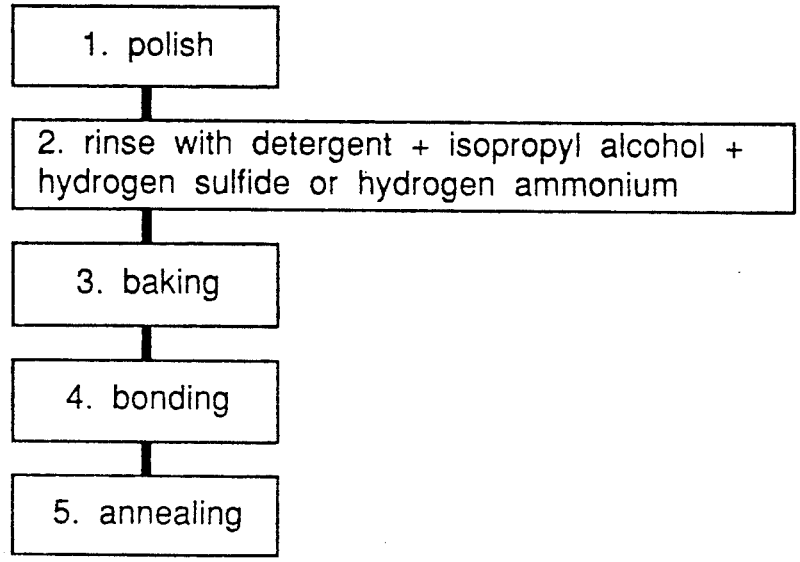
FIG. 3 is a flowchart of a method of directly bonding crystals in accordance with a third embodiment of the present invention.

FIG. 3 is a flowchart of a method of directly bonding crystals in accordance with the third embodiment of the present invention. The bonding process includes: 1) mirror-polishing, 2) rinsing, 3) baking, 4) bonding, and 5) annealing.

The basic process and effect of the third embodiment of the present invention is similar to that of the first embodiment of the present invention. In the third embodiment of the present invention, the crystal surfaces can be chemically polished by the rinsing operation of hydrogen water fluoride or ammonium fluoride so that cleaner surfaces can be obtained.

In the first, second and third embodiments of the present invention, a step of retaining the blanks for long hours in a dried atmosphere, instead of a baking operation may be used.

A fourth embodiment of the present invention will be described hereinafter with reference to the drawings.

Figure 4A:
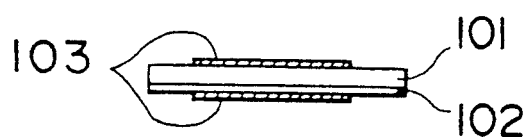
FIG. 4 (a) is a side view of a crystal resonator in accordance with a fourth embodiment of the present invention, and FIG. 4 (b) is a plan view of a crystal resonator in the same embodiment thereof, and FIG. 4 (c) is a schematic view of crystal axes of a crystal blank in the same embodiment.
Figure 4B:
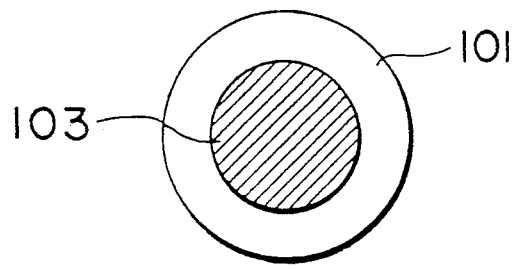
Figure 4C:
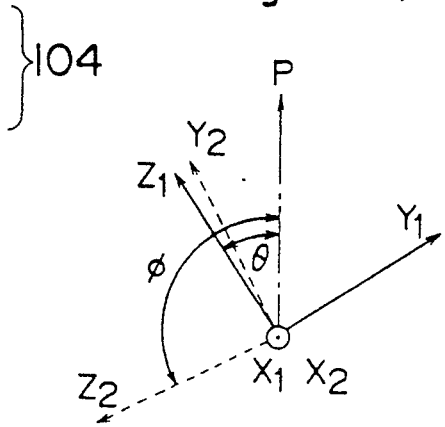
Figure 6A:
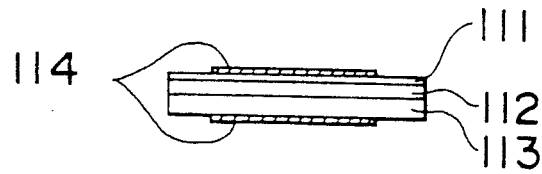
FIG. 6 (a) is a side face view of a crystal resonator in accordance with a fifth embodiment of the present invention, and FIG. 6 (b) is a plan view of the crystal resonator in the same embodiment, and FIG. 6 (c) is a schematic view of crystal axes of a crystal blank in the same embodiment.
Figure 6B:
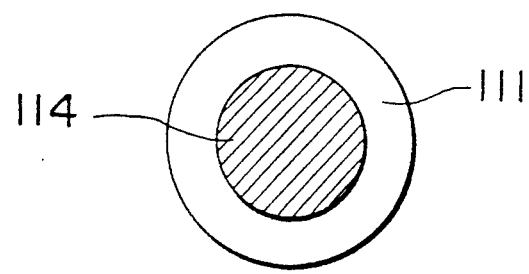
Figure 6C:
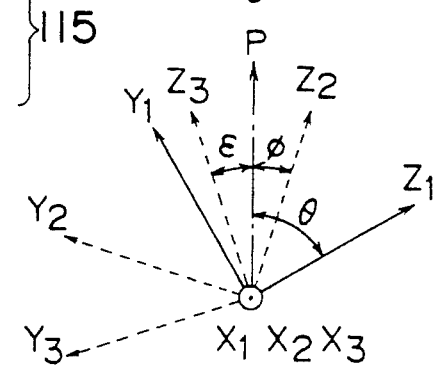

FIGS. 4(a)–4(c) show a crystal resonator in accordance with the fourth embodiment of the present invention. FIG. 4 (a) is a side face view, FIG. 4 (b) is a plan view seen from above, and FIG. 4 (c) is a schematic view of crystal axes of a crystal blank. In FIGS. 4(a)–4(c), elements 101 and 102 are crystal blanks, and elements 103 are electrodes. Element character P is a normal of both crystal blanks 101 and 102. Elements X1, Y1 and Z1 are the crystal axes of the crystal blank 101; elements X2, Y2 and Z2 are the crystal axes of the crystal blank 102; $\theta$ is an angle between the Z1-axis and the normal P; $\phi$ is an angle between the Z2-axis and the normal P. The crystal blanks 101 and 102 are directly bonded and become integral so that the X1 is in conformity with X2 so as to form a ply crystal blank 104. The electrodes 103 are oppositely set on the ply crystal blank 104.

The operation of the crystal resonator constructed as described hereinabove described hereinafter.

Figure 5:
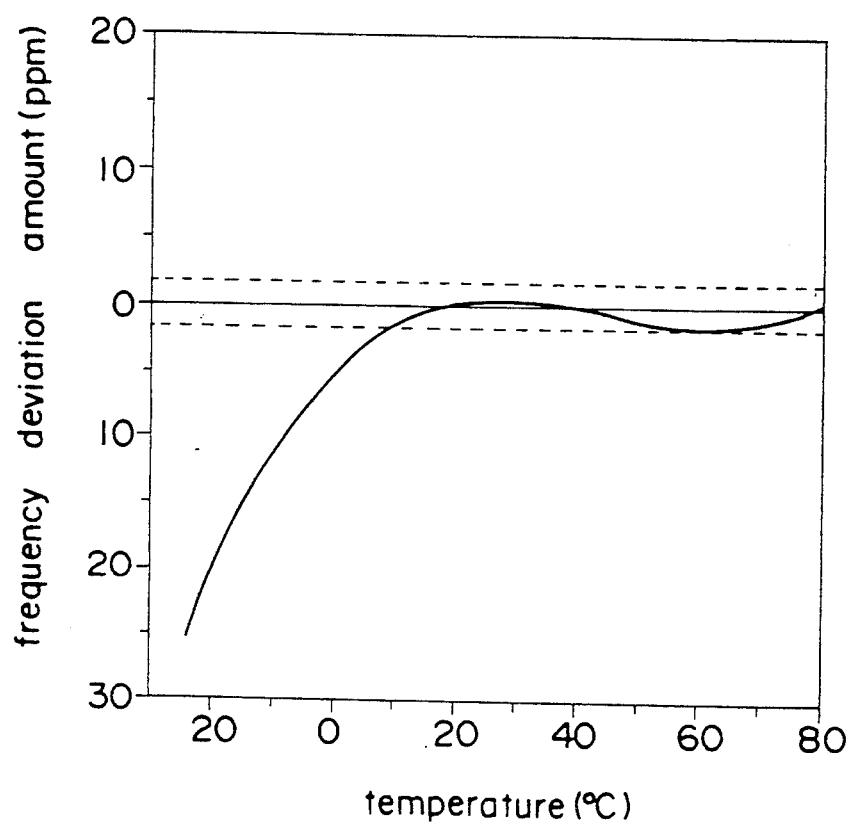
FIG. 5 is a graph showing one embodiment of a resonant frequency-temperature characteristics of a ply crystal blank.

The crystal blanks 101 and 102 are strained when an electric field (electric field in the P direction) is applied across the electrodes 103. The respective resonant frequencies f1 and f2 are represented by the numerical equation 1 using the respective thickness and elastic constants. As the crystal blanks 101 and 102 are directly bonded to each other, elastic vibrations are continuous in the bonding face. The resonant frequency f of the ply crystal blank 104 is represented by the numerical equation 2. Therefore, the temperature characteristic of the ply crystal blank 104 is determined by a ratio of the resonance frequency-temperature characteristics (namely, cut angles $\theta$ and $\phi$) and the thickness of the crystal blanks 101 and 102. Suppose that the ratio in thickness between the crystal blank 101 and the crystal blank 102 is 5:1, and $\theta$ and $\phi$ are respectively 55.01° and 145.00°, and the frequency stability of ±1.0 ppm in the temperature range of 10° through 85° C. is as shown in FIG. 5.

A fifth embodiment of the present invention will be described hereinafter with reference to the drawings.

FIGS. 6(a)–6(d) shows a crystal resonator in accordance with the fifth embodiment of the present invention. FIG. 6 (a) is a side face view, FIG. 6 (b) is a plan view of the FIG. 6(a) seen from above, and FIG. 6 (c) is a schematic view of crystal axes of a crystal blank.

In FIGS. 6(a)–6(d), elements 111, 112 and 113 are crystal blanks, and elements 114 are electrodes. Element numeral P is a normal of all of the plate faces of the crystal blanks 111, 112 and 113. X1, Y1 and Z1 are the crystal axes of a crystal blank 111; X2, Y2 and Z2 are the crystal axes of the crystal blank 112, X3, Y3 and Z3 are crystal axes of the crystal blank 113, $\theta$, $\phi$ and $\epsilon$ are respectively an angle between the Z1-axis and the normal P, an angle between the Z2-axis and the normal P, and an angle between the Z3-axis and the normal P. The crystal blanks 12 and 113 are directly bonded and become integral so that X1, X2 and X3 conform, and become a ply crystal blank 115. The electrodes 114 are oppositely set the ply crystal blank 115.

The resonant frequency-temperature characteristics of the crystal resonator constructed as described hereinabove can be set by a ratio of the thicknesses of the crystal blanks 111, 112 and 113, and the respective cut angles $\theta$, $\phi$ and $\epsilon$ as in the fourth embodiment.

A sixth embodiment of the present invention will be described hereinafter with reference to the drawings.

Figure 7A:
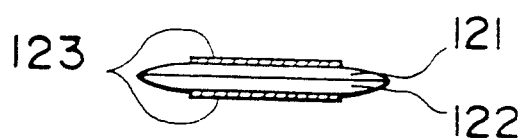
FIG. 7 (a) is a side face view of a crystal resonator in accorance with a sixth embodiment of the present invention, and FIG. 7 (b) is a plan view of a crystal resonator in the same embodiment, and FIG. 7 (c) is a schematic view of crystal axes of a crystal blank in the same embodiment.
Figure 7B:
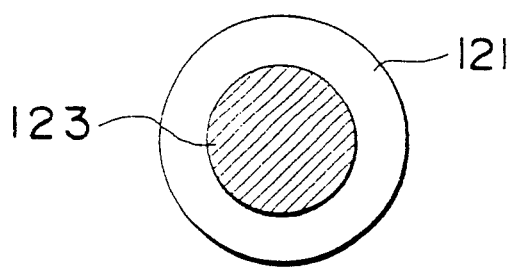
Figure 7C:
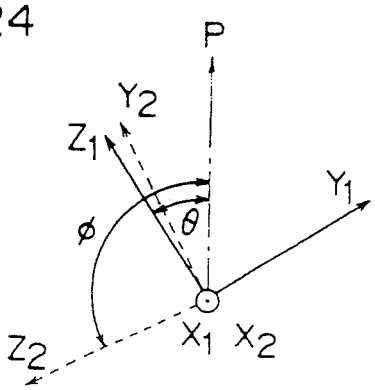

FIGS. 7(a)–7(c) show a crystal resonator in accordance with the sixth embodiment of the present invention. FIG. 7 (a) is a side face view, FIG. 7 (b) is plan view of FIG. 7 (a) seen from above, and FIG. 7 (c) is a schematic view of crystal axes of a crystal blank. In FIGS. 7(a)–7(c), elements 121 and 122 are crystal blanks, and elements 123 are electrodes. The crystal blanks 121 and 122 are provided in the respective single faces with the central portions being made thicker, and are thinly worked (convexly worked) towards the end portions. The crystal blanks 121 and 122 are directly bonded and become integral on the side not worked convexly as shown in the fourth embodiment, and become a ply crystal 124. Also, the electrodes 123 are oppositely set across the ply crystal blank 124.

According to he above described construction, the resonant frequency can be stably retained across the wide temperature range and at the same time, the central portion of the ply crystal blank 124 is made thinner and thinner towards the end portion as shown in the fourth embodiment. An effect of containing in the elastic vibrations in the central portion is obtained so that a high Q crystal resonator can be realized.

In the present invention, the crystal blanks 121 and 122 can obtain similar effects even using a crystal blank convexly worked in both the faces or worked (bevel worked) with the corner of the end portion on the single face or both the faces being removed.

In the fourth, fifth and sixth embodiments of the present invention, no restriction is applied to the cut angle, thickness, number of the crystal blanks to be directly bonded and the relationship of the mutual crystal axes for construction of the ply crystal blank. The ply crystal blank can be set so as to have the desired resonant frequency-temperature characteristics.

Even in the vibration mode except for the thickness shear mode, the desired temperature characteristics can be realized using a ply crystal blank as shown in the fourth and fifth embodiments of the present invention.

The seventh through tenth embodiments of the present invention will be described hereinafter with reference to the drawings.

FIGS. 8(a) through FIG. 11(b) respectively show crystal resonators in the seventh to the tenth embodiments of the present invention, wherein FIGS. 8(a), 9(a), 10(a) and 11(a) are side face views, and FIGS. 8(b), 9(b), 10(b) and 11(b) are plan views thereof seen from above in the respective drawings.

Figure 8A:
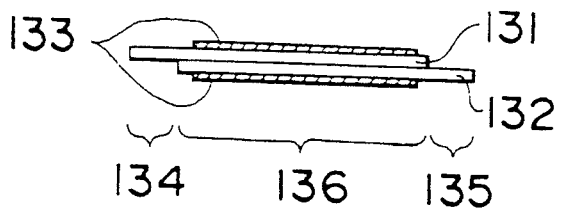
FIG. 8 (a) is a side face view of a crystal resonator in accordance with a seventh embodiment of the present invention, and FIG. 8 (b) is a plan view of a crystal resonator in the same embodiment.
Figure 8B:
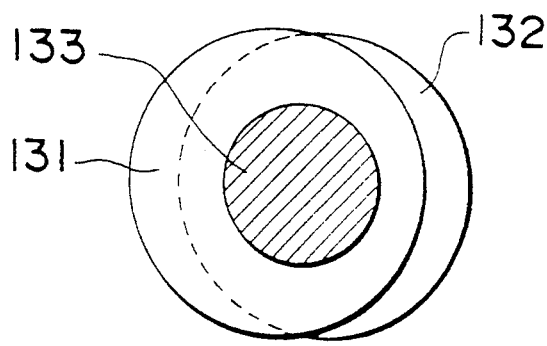

In FIGS. 8(a)–8(b), elements 131 and 132 are crystal blanks; elements 133 are electrodes, elements 134 and 135 are support portions; and element 136 is a vibrating portion. The crystal blanks 131 and 132 are directly bonded and become integral in the vibrating portion 136 and become a ply crystal blank 137. The electrode 133 are oppositely set across the vibrating portion 136.

In FIGS. 9(a)–9(b), element 141 is a crystal blank; element 142 is a crystal blank larger than the crystal blank 141; elements 143 are electrodes, elements 144 and 145 are support portions; and element 146 is a vibrating portion. The crystal blanks 141 and 142 become integral so that respective centers may be in approximate conformity with each other and become a ply crystal blank 147. The electrode 143 is oppositely set across a vibrating portion 146.

In FIGS. 10(a)–10(b), elements 151, 152 and 153 are crystal blanks; elements 154 are electrodes; elements 155 and 156 are support portions; and element 157 is a vibrating portion. The crystal blank 152 and 153 are smaller than the crystal blank 151, and the crystal blanks 151, 152 and 153 are directly coupled, integral so that the respective centers may be brought into approximate conformity with each other in the order shown in FIGS. 9(a)–9(b), and become a ply crystal blank 158. Also, the electrodes 154 are oppositely set across the vibrating portion 157.

In FIGS. 11(a)–11(b), elements 161, 162 and 163 are crystal blanks; elements 164 are electrodes; elements 165 and 166 are support portions; and element 167 is a vibrating portion. The crystal blanks 161, 162 and 163 are directly bonded and become integral in an order shown in FIGS. 11(a)–11(b) and become a ply crystal blank 168. The electrodes 164 are oppositely set across the vibrating portion 167.

In the seventh to tenth embodiments constructed as described hereinabove, the vibrating portion causes the thickness shear strain when an electric field is applied upon the electrode, the resonant frequency of the vibrating portion is determined by the thickness and the elastic constant of the respective crystal blanks as shown in the numerical equation 1 and the numerical equation 2. Although the elastic vibrations caused in the vibrating portion would to be transmitted to the end portion of the ply crystal blank through the support portion, the elastic vibrations are suddenly damped in the support portion, because the thickness of the support portion is adapted to be made thinner than the vibrating portion.

Accordingly to the seventh to the tenth embodiments, at least two sheets of crystal blanks are directly bonded so as to construct a ply crystal blank thicker in the central portion and the electrodes are set through the thicker portion of the above described central portion. Therefore, the elastic vibrations can be shut in and the crystal resonator of a high Q can be easily realized.

An eleventh embodiment of the present invention will be described hereinafter with reference to the drawings.

FIGS. 12(a)–12(b) show a crystal resonator in accordance with the eleventh embodiment of the present invention; FIG. 12 (a) is a side face view, and FIG. 12 (b) is a plan view of the resonator of FIG. 12(a) as seen from above. In FIGS. 12(a)–12(b), element 171 is a crystal blank having a hole drilled in its central portion; element numeral 172 is a crystal blank; and element 173 is an electrode. Crystal blanks 171 and 172 are directly bonded to each other and become integral so as to compose a ply crystal blank 174. The electrodes 173 are oppositely set across a crystal blank 172 in a vibrating portion 177 where the crystal blanks 171 and 172 of the central portion are not plied. Support portions 175 and 176 are formed in a region where the crystal blanks 171 and 172 are directly bonded to each other.

The crystal blank 172 causes the thickness shear strains in the present embodiment constructed as described hereinabove when an electric field is applied due to a voltage supplied across the electrodes 173. The resonant frequency of the vibrating portion is determined by the thickness and the elastic constant as shown by numerical equation 1 and numerical equation 2.

In the present embodiment, at least two sheets of crystal blanks are directly bonded to each other so as to construct a ply crystal blank with its central portion being thinner and an electrode is set through the thinner portion of the above described central portion. Therefore, the elastic vibrations can be shut in and a crystal resonator of a high Q can be easily realized.

In the seventh, eighth, ninth, tenth and eleventh embodiments, similar effects can be obtained if the thickness of the vibrating portion is thicker or thinner than the thickness of the support portion without any restriction to the number and thickness of the directly bonded crystal blanks. When a crystal blank of such cut angle and thickness as shown in, for example, the fourth, fifth and sixth embodiments of the present invention is directly bonded to another blank in such a crystal axis relationship as shown in the fourth, fifth and sixth embodiments of the present invention so as to constitute the vibrating portion, a crystal resonator which is stable in resonant frequency-temperature characteristic and is high in Q can be realized.

No restrictions are given to the shapes of the vibrating portion and the support portion in the seventh, eighth, ninth, tenth and eleventh embodiments of the present invention. An optional shape such as square plate shape or the like can be used as the shape of the crystal blank without adhering to the disc shape shown in the embodiment of the present invention.

In the fourth, fifth, seventh, eighth, ninth, tenth and eleventh embodiments of the present invention, a crystal blank where a convex working operation or a bevel working operation of such both the faces or the single face as shown in the sixth embodiment of the present invention has been effected on the crystal blank may be used. A crystal blank convexly worked or bevel worked may be combined with a plate crystal blank.

A twelfth and a thirteenth embodiment of the present invention will be described hereinafter with reference to the drawings.

FIG. 13 and FIG. 14 show a crystal resonator in the twelfth and thirteenth embodiments of the present invention.

In FIG. 13, elements 181 and 182 are crystal blanks, and elements 184 and 185 are electrodes. The crystal blanks 181 and 182 are mutually bonded directly and become integral so as to form a ply crystal blank 186. The ply crystal blank 186 has a direct bonding portion 183 of the thickness of the crystal blanks 181 and 182, and a thickness portion of the crystal blank 181 only. The electrodes 184 are oppositely set across a direct bonding portion 183, and the electrodes 185 are oppositely set across a crystal blank 181.

In FIG. 14, elements 191, 192 and 193 are crystal blanks, and elements 195 and 196 are electrodes. The crystal blanks 191, 192 and 193 are mutually bonded directly and become integral so as to form a ply crystal blank 197. The ply crystal blank 197 has a directly bonding portion 194 of the thickness of crystal blanks 191, 192 and 193 combined and a thickness portion of the crystal blank 191. The electrodes 196 are oppositely set across the directly bonding portion 194, and the electrodes 195 are oppositely set across the crystal blank 191.

In the twelfth and thirteenth embodiments constructed as described hereinabove, the thickness shear strain is caused when the electric field is generated across the electrodes so as to resonate the crystal blank between the electrodes by the resonant frequency represented by the numerical equation 1. The direct bonding portion is vibrated at the resonant frequency expressed by the numerical equation 2 as described in the fourth embodiment.

The fourteenth embodiment of the present invention will be described hereinafter with reference to the drawings.

In FIG. 15, elements 201 and 202 are crystal blanks, and elements 204, 205 and 206 are electrodes. The crystal blanks 201 and 202 are mutually bonded directly and become integral so as to form a ply crystal blank 207. The ply crystal blank 207 has a direct bonding portion 203 of the thickness of the crystal blanks 201 and 202 combined, and a portion of the thickness of only the crystal blanks 201 and 202. The electrodes 204 are oppositely set across the direct bonding portion 203. The electrodes 205 and 206 are respectively oppositely set across crystal blanks 201 and 202.

According to the present embodiment as described hereinabove, a crystal resonator having three alternative resonant frequencies can be realized as in the twelfth and the thirteenth embodiments.

The fifteenth and sixteenth embodiments of the present invention will be described with reference to the drawings.

FIG. 16 and FIG. 17 are respectively crystal resonators in accordance with the fifteenth and sixteenth embodiments of the present invention.

In FIG. 16, elements 211, 212 and 213 are crystal blanks, and elements 216 and 217 are electrodes. The crystal blank 211 is directly bonded to the crystal blanks 212 and 213, and become integral so as to form a ply crystal blank 218. A ply crystal blank 218 has a direct bonding portion 214 of the thickness of the crystal blanks 211 and 212 combined, and a direct bonding portion 215 of the thickness of crystal blanks 211 and 213 combined, and further, has a portion of the thickness of only the crystal blank 211 between the direct bonding portions 214 and 215. The electrodes 216 are oppositely set across the direct bonding portion 214, and the electrodes 217 are oppositely set across the direct bonding portion 215.

In FIG. 17, elements 221, 222, 223 and 224 are crystal blanks, and elements 227 and 228 are electrodes. The crystal blank 221 is directly bonded to the crystal blanks 222, 223 and 224, and becomes integral so as to form a ply crystal blank 229. A ply crystal blank 229 has a direct bonding portion 215 of the thickness of the crystal blanks 221, 222 and 223 combined and a direct bonding portion 226 of the thickness of a crystal blanks 221 and 224 combined, and further, has a portion of the thickness of only the crystal blanks 221 between the direct bonding portions 225 and 226. The electrodes 227 are oppositely set across the direct bonding portion 225, and the electrodes 228 are oppositely set across the direct bonding portion 226.

According to the fifteenth and sixteenth embodiments, a crystal resonator having two alternative resonant frequencies can be obtained, and furthermore, a region thinner than both the direct bonding portions is provided between two direct bonding portions as in the twelfth and thirteenth embodiments. Elastic vibrations caused in each of the two direct bonding portions are contained therein so that isolation between the elastic vibrations can be increased.

A seventeenth embodiment of the present invention will be described with reference to the drawings.

FIG. 18 shows a crystal resonator in accordance with the seventeenth embodiment of the present invention.

In FIG. 18, elements 231, 232, 233 are crystal blanks, and elements 237 and 238 are electrodes. The crystal blank 231 and crystal blanks 232 and 233 are respectively directly bonded and become integral so as to form a ply crystal blank 239. A ply crystal blank 239 has a direct bonding portion 234 of the thickness of the crystal blanks 231 and 232 combined, a direct bonding portion 235 of the thickness of crystal blanks 231 and 233 combined, and a direct bonding portion 236 of the thickness of the crystal blanks 231, 232 and 233 combined. The electrodes 237 are oppositely set across the direct bonding portion 234 and the electrodes 238 are oppositely set across the direct bonding portion 235.

According to the present embodiment as described hereinabove, a crystal resonator having two alternative resonance frequencies can be obtained as in the twelfth and thirteenth embodiments, and furthermore, a direct bonding portion 236 thicker than both the direct bonding portions between the direct bonding portions 234 and 235 can be provided. Elastic vibrations caused in each of two direct bonding portions 234 and 235 are contained therein so that isolation between the elastic vibrations can be increased.

In the twelfth, thirteenth, fourteenth, fifteenth, sixteenth and seventeenth embodiments of the present invention, no restrictions are given to the number of the crystal blanks, cut angle, thickness and crystal axis relationship in the direct bonding operation. As shown in, for example, the fourth, fifth and sixth of the present invention, the respective crystal blanks or ply crystal blank portions may be freely set to have the desired resonance frequency-temperature characteristics.

In the embodiments of the twelfth, thirteenth, fourteenth, fifteenth, sixteenth and seventeenth embodiments of the present invention, the desired frequencies can be obtained without restriction to the number of the electrodes.

In the twelfth, thirteenth, fourteenth, fifteenth, sixteenth and seventeenth embodiments of the present invention, the shape such as circle, square or the like can be optionally set without restriction to the shape of the crystal blank and the shape of the electrode. Such convexly worked crystal blank as shown in the sixth embodiment can be used for the crystal blank.

In the fourth through seventeenth embodiments of the present invention, number of the electrodes, pattern shape, combination and thickness are not restricted.

The eighteenth embodiment of the present invention will be described hereinafter with reference to the drawings.

FIG. 19 is a block diagram showing a crystal oscillator in accordance with the eighteenth embodiment of the present invention.

In FIG. 19, element 242 is an oscillating circuit, and element 243 is an output terminal. Element 241 is a crystal resonator such as described in the fourth to the eleventh embodiments of the present invention, in which the electrodes are adapted to be oppositely set across a ply crystal blank where at least two crystal blanks having the desired cut angle and the desired thickness are directly bonded so that the respective crystal axes intersect at a described angle. The crystal resonator 241 is stable in the resonant frequency across a wide temperature range.

In the crystal oscillator constructed as described hereinabove, the oscillating conditions are satisfied by the oscillating circuit 242 and the crystal resonator 241 at the frequency within the vicinity of the resonant frequency of the crystal resonator 241, and the oscillating frequency is outputted from the output terminal 243. The output frequency-temperature characteristics are mainly determined by the resonant frequency-temperature characteristics of the crystal resonator 241.

Since a crystal resonator 241 which is stable with respect temperature as shown in the fourth to the eleventh embodiments is used as a resonant element according to the present embodiment as described hereinabove, a crystal oscillator which is stable with respect to its output frequency can be realized across a wide temperature range.

A nineteenth embodiment of the present invention will be described hereinafter with reference to the drawings.

FIG. 20 is a block diagram of an analog temperature compensated crystal oscillator in accordance with the nineteenth embodiment of the present invention. In FIG. 20, element 252 is a temperature compensating circuit; element 253 is an oscillating circuit; and element 254 is an output terminal. The temperature compensating circuit 252 is composed of a temperature sensing element, a resistor, a capacity element and so on, and is a circuit which changes in reactance with temperature. Element 251 is a crystal resonator such as described in the fourth embodiment to the seventh embodiment of the present invention in which the electrodes are adapted to be oppositely set across a ply crystal blank where at least two crystal blanks having the desired cut angle and the desired thickness may are directly bonded so that the respective crystal axes intersect at a desired angle. The crystal resonator 252 is a stable in its resonant frequency across a wide temperature range.

In an analog temperature compensated crystal oscillator constructed as described hereinabove, the change due to temperature of the reactance (resonant frequency) of the crystal resonator 251 is compensated for by the temperature compensating circuit 252 so as to stabilize the output frequency-temperature characteristics. Since the frequency stability of ±1.0 ppm in the temperature range from 10° to 85° C. is obtained as shown in FIG. 5 for crystal resonator 252, the temperature range which compensation is required becomes −30° to 10° C.

When a temperature compensated crystal oscillator for a mobile communication device such as a portable telephone or the like is constructed, the temperature compensating circuit conventionally required independently for high temperature use and low temperature use will do with only the temperature compensating circuit for low temperature, so that the circuit scale of the temperature compensating circuit 252 can be halved.

The scale of the temperature compensating circuit can be halved using the stable crystal resonator of the resonant frequency across a wide temperature range as shown in the fourth to the eleventh embodiments of the present invention. As the manufacturing step and the adjusting step can be simplified, an analog temperature compensated crystal oscillator which is small in size and lower in price can be realized.

In the nineteenth embodiment of the present invention, a thermistor, a diode or the like can be used as a temperature sensing element. A capacitor, or a varactor diode or the like can be used as a capacity element.

The twentieth through twenty second embodiments of the present invention will be described with reference to the drawings.

FIG. 21 to FIG. 23 are block diagrams of a digital temperature compensated crystal oscillator in accordance with the twentieth through twenty second embodiments of the present invention.

In FIG. 21, element 266 is a temperature sensor; element 265 is an A/D convertor; element 264 is a memory; element 263 is a variable reactance circuit of a digital signal control circuit; and element 262 is an oscillating circuit. Element 261 is a crystal resonator such as described in the fourth to the eleventh embodiment of the present invention; the electrodes are oppositely set across a ply crystal blank where at least two crystal blanks having the desired cut angle and the desired thickness are directly bonded so that the respective crystal axes intersect at a desired angle. The crystal resonator 261 is a stable crystal resonator across a wide temperature range. Element 267 is digital controlled crystal oscillator composed of a crystal resonator 261, a variable reactance circuit 263 and an oscillating circuit 262.

In FIG. 22, element 273 is a temperature sensor; element 274 is an A/D convertor; element 275 is a memory; element 276 is a programmable frequency divider; element 272 is a crystal oscillator, and element 271 is a crystal resonator stable which has a resonant frequency across a wide temperature range as described in the fourth to eleventh embodiments of the present invention; the electrodes are adapted to be oppositely set across a ply crystal blank where at least two crystal blanks having the desired cut angle and the desired thickness are directly bonded so that the respective crystal axes intersect at a desired angle. The crystal resonator 271 becomes a resonant element of the crystal oscillator 272.

In FIG. 23, element 282 and 283 are crystal oscillators; element 284 is a frequency counter; element 285 is a memory; element 286 is a programmable divider; element 281 is a crystal resonator which has a stable resonant frequency across a wide temperature range as described in the fourth to eleventh embodiments of the present invention; the electrodes are adapted to be oppositely set across a ply crystal blank where at least two crystal blanks having the desired cut angle and the desired thickness are directly bonded so that the respective crystal axes intersect at a desired angle. The crystal resonator 281 becomes a resonant element of the crystal oscillator 282. The crystal oscillator 283 is a crystal oscillator to be used as a temperature sensor, and is constructed using a crystal resonator having the resonant frequency-temperature characteristics which make it easy to detect temperature.

In a digital temperature compensated crystal oscillator constructed as described hereinabove, the data with the digital signals where the output signals of the temperature sensor are converted by an A/D convertor, and the control signals of the variable reactance circuit or the programmable frequency divider being made corresponding are stored in advance in the memory. Thus, the reactance of the variable reactance circuit or the frequency dividing ratio of the programmable frequency divisor changes in accordance with the temperature change to compensate for the resonant frequency-temperature characteristics of the crystal resonators 261, 271 and 281 so as to stabilize the oscillation output frequency. As the frequency stability of ±1.0 ppm in the temperature range from 10° C. to 85° C. is obtained as shown in FIG. 5, the temperature range in which compensation is required becomes −30° to 10° C. for the crystal resonators 261, 271 and 281 when used in a temperature compensated crystal oscillator for a mobile communication device such as a portable telephone or the like. The temperature range is considerably reduced to be as low as approximately 2/5 of the conventional.

According to the twentieth to twenty second embodiments of the present invention, the compensating temperature range is considerably reduced, the capacity of the memory, and the number of bits of the A/D convertor can be reduced, and the manufacturing and adjusting steps can be simplified, because the crystal resonator is used across a wide temperature range as shown in the fourth to eleventh embodiments of the present invention. Thus, a digital temperature compensated crystal oscillator of lower size, lower consumption current, and lower price can be realized.

An element and a circuit in which changes in electric potential difference and current value due to temperature can be used as a temperature sensor using a a thermistor, a diode and so on can be used in the twentieth and twenty first embodiments of the present invention. A crystal oscillator can be used as a temperature sensor in the twentieth and twenty first embodiment. When a crystal oscillator is used, a frequency counter can be used as an A/D convertor.

In the twentieth embodiment of the present invention, a system of applying the output voltage of the D/A convertor to the varactor diode, a system of changing the capacitance directly by a switching operation through digital signals, or other systems can be used with, for example, a D/A convertor and a varactor diode used as the variable reactance circuit.

In the twenty second embodiment of the present invention, the crystal resonator 281 and the crystal resonator to be used in the crystal resonator 283 can be integrated by the such construction as in, for example, the twelfth, the thirteenth, fifteenth, sixteenth and seventeenth embodiments of the present invention.

In the eighteenth, nineteenth, twentieth, twenty first and twenty second embodiments of the present invention, the crystal resonators 241, 251, 261, 271 and 281 are not necessarily required to use the crystal resonator having such resonant frequency-temperature characteristics as shown in FIG. 5. Since resonant frequency-temperature characteristics which are stable in the desired temperature range are obtained, the number of crystal blanks to be directly bonded, the respective cut angle, thickness and the crystal axis relationship can be optionally set.

The twenty third to twenty sixth embodiments of the present invention will be described hereinafter with reference to the drawings.

FIG. 24 through FIG. 27 show a digital temperature compensated crystal oscillator in accordance with the twenty third to twenty sixth embodiments of the present invention.

In FIG. 24, element 291 is a crystal resonator which is adapted to output two vibrations having resonance frequency and temperature characteristics as shown in a twelfth embodiment of the present invention. Elements 292 and 293 are two vibrating portions formed on the crystal oscillator 291. Element 294 is an oscillating circuit; element 295 is a variable reluctance circuit controlled by a digital signal; and element 296 is a digital controlled crystal oscillator composed of a vibrating portion 292, an oscillating circuit 294 and a variable reluctance circuit 295. Element 297 is a memory; and element 298 is an A/D convertor. Element 299 is an oscillating circuit; and element 300 is a temperature sensor composed of an oscillation portion 293 and an oscillation circuit 299. Two crystal blanks constituting a crystal resonator 291 are directly bonded with the cut angle, the thickness and the crystal axis relationship being set so that the resonator portion 293 has such resonant frequency-temperature characteristics as to easily detect the temperature, and the vibrating portion 292 has stable resonance frequency-temperature characteristics.

In FIG. 25, element 301 is a crystal resonator which is adapted to output two vibrations having resonance frequency and temperature characteristics as shown in a twelfth embodiment of the present invention. Elements 302 and 303 are two vibrating portions formed on the crystal oscillator 301. Element 304 is a digital controlled crystal oscillator composed of a resonator portion 302, an oscillation circuit 294 and a variable reactance circuit 295. Element 305 is a temperature sensor composed of a vibrating portion 303 and an oscillation circuit 299. Two crystal blanks composed of a crystal resonator 301 are directly bonded with the cut angle, the thickness and the crystal axis relationship being set so that the vibrating portion 303 has such resonant frequency-temperature characteristics as to easily detect the temperature, and the vibrating portion 302 has stable resonant frequency-temperature characteristics.

In FIG. 26, element 311 is a crystal oscillator which is adapted to output two vibrations having resonance frequency and temperature characteristics as shown in the thirteenth embodiment of the present invention. Elements 312 and 313 are two vibrating portions formed on the crystal resonator 311. Element 314 is a digital controlled crystal oscillator composed of a vibrating portion 312, an oscillation circuit 294 and a variable reactance circuit 295; and element numeral 315 is a temperature sensor composed of a vibrating portion 313 and an oscillation circuit 299. Three sheets of crystal blanks constituting a crystal resonator 311 are directly bonded with the cut angle, the thickness and the crystal axis relationship being set so that the vibrating portion 313 has such resonant frequency-temperature characteristics as to easily detect the temperature and the vibrating portion 312 stable resonant frequency-temperature characteristics.

In FIG. 27, element 321 is a crystal resonator which is adapted to output two vibrations having resonant frequency and temperature characteristics in as shown in the fifteenth embodiment of the present invention. Elements 322 and 323 are two vibrating portions formed on the crystal resonator 321. Element 324 is a digital controlled crystal oscillator composed of a vibrating portion 322, an oscillation circuit 294 and a variable reactance circuit 295; element 325 is a temperature sensor composed of a vibrating portion 323 and an oscillation circuit 299. Three sheets of crystal blanks constituting a crystal resonator 321 are directly bonded with the cut angle, the thickness and the crystal axis relationship being set that the vibrating portion 323 has such resonant frequency-temperature characteristics so as to easily detect the temperature and the vibrating portion 322 has stable resonant frequency-temperature characteristics.

In the digital temperature compensated crystal oscillator constructed as described hereinabove, the data with the digital signals, where the output signal of the temperature sensor is converted by the A/D convertor, and the control signals of the variable reactance circuit being corresponded are stored in advance in the memory. The reactance of the variable reactance circuit changes in accordance with the temperature change so as to stabilize the output frequency of the digitally controlled oscillator. As the vibrating portions for the temperature sensor use and the digital controlled crystal oscillator use are integrally formed, the temperature difference between them become almost zero so that the temperature information of the vibrating portion for the digital controlled crystal oscillator use can be correctly obtained.

According to the twenty third to the twenty sixth embodiments of the present invention, the resonator portions for temperature sensor use and the digital controlled crystal oscillator use can be integrally formed with the crystal resonator which is adapted to output two vibrations having the optional resonance frequency and temperature characteristics as shown in the twelfth, the thirteenth, the fifteenth embodiments of the present invention. A digital temperature compensated crystal oscillator can be realized, which is smaller in size and lower in price, and can effect high-accuracy temperature compensation even with a small number of bits, because the respective vibrating portions can be set separately to their optimum temperature characteristics.

In the twenty fifth embodiment, the vibrating portion 312 is composed of three sheets of crystal blanks plied. The resonance frequency-temperature characteristics which are higher in stability than the twenty third and twenty fourth embodiments can be provided. A digital temperature compensated crystal oscillator which is higher in accuracy and which has a lower number of bits can be realized.

Since a region which is thinner than thickness of either of both the vibrating portions is provided between two vibrating portions in the twenty sixth embodiment, isolation between the elastic vibrations respectively caused in the vibrating portions can be made higher. Although the thickness between two vibrating portions is adapted to be made thinner than the thickness of the either of the vibrating portions in the twenty sixth embodiment of the present invention, it is not necessarily required to make them thinner. A similar effect can be obtained even when the thickness between the two vibrating portions has been made thicker than the thickness of the vibrating portions as in the crystal resonator described in the seventeenth embodiment of the present invention.

A twenty seventh embodiment of the present invention will be described hereinafter with reference to the drawings.

FIG. 28 shows the twenty seventh embodiment of a digital temperature compensated crystal oscillator of the present invention. In FIG. 28, element 331 is a crystal resonator which is adapted to output vibrations having three alternative resonant frequency and temperature characteristics as shown in the fourteenth embodiment of the present invention. Elements 332, 333 and 334 are three vibrating portions formed on the crystal resonator 331. Element 338 is an oscillation circuit. Element 335 is a digitally controlled crystal oscillator composed of a vibrating portion 332, an oscillation circuit 294 and a variable reactance circuit 295. Element 336 is a temperature sensor composed of an vibrating portion 333 and an oscillation circuit 299. Element 337 is a temperature sensor composed of a vibrating portion 334 and an oscillation circuit 338. Two sheets of crystal blanks constituting the crystal oscillator 331 are directly bonded with the cut angle, the thickness and the crystal axis relationship set so that the vibrating portions 333 and 334 may have such resonant frequency-temperature characteristics as to easily detect the temperature, and the vibrating portion 332 has a stable resonant frequency-temperature characteristics.

According to the twenty seventh embodiment of the present invention, the temperature detection can be effected with more accuracy, because the temperature detection is effected with the use of temperature sensors 336 and 337 in addition to the effects of the twenty third to the twenty sixth embodiments of the present invention.

In the twenty seventh embodiment of the present invention, four or more sets of electrodes may be provided. Similar effects are obtained even when four or more sets of electrodes or more has been formed.

In the twenty third to twenty seventh embodiments of the present invention, no restrictions are given to the crystal piece cut angle, thickness, shape and the number of crystal blanks. The vibrating portions can be set freely to have the desired characteristics. The relationship of the crystal axis in the plying operation can be set freely so that desired characteristics may be obtained.

In the twenty third to twenty seventh embodiments of the present invention, a frequency counter can be used as an A/D convertor.

In the twenty third to twenty seventh embodiments of the present invention, a system of applying the output voltage of the D/A convertor to the varactor diode, a system of changing the capacitance directly with a switching operation through the digital signal, or other systems can be used with, for example, a D/A convertor and a varactor diode.

The twenty eighth embodiment of the present invention will be described with reference to the drawings.

Figure 29A:
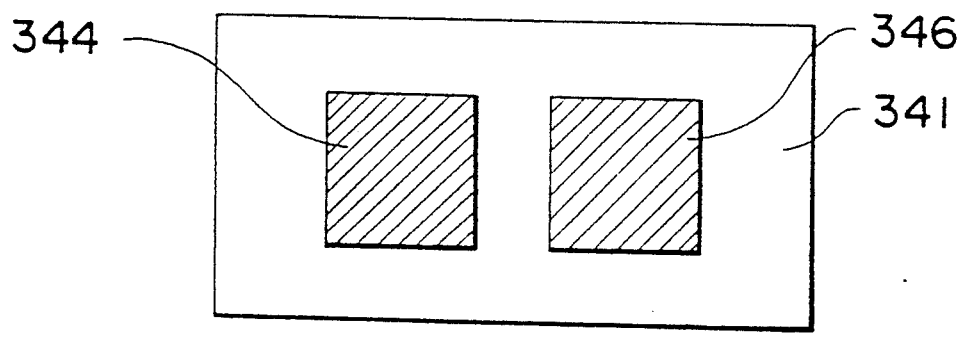
Figure 29B:
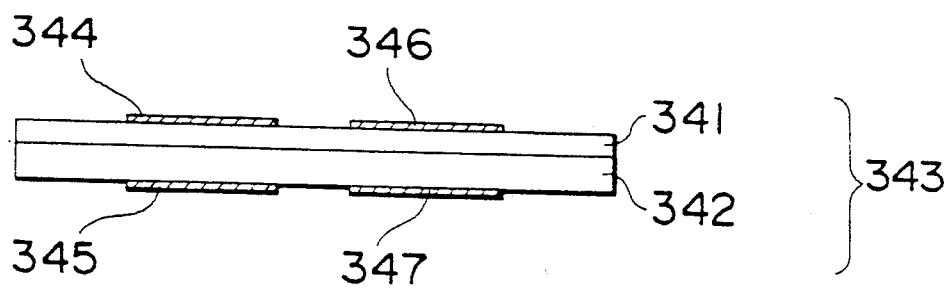

FIGS. 29(a)-29(b) show the crystal filter construction in accordance with the twenty eighth embodiment of the present invention; FIG. 29 (a) is a top face view and FIG. 29 (b) is a side face view. In FIGS. 29(a)-29(b), elements 341 and 342 are crystal blanks, and elements 344, 345, 346 and 347 are electrodes. The crystal blanks 341 and 342 have the desired cut angle and the desired thickness so that the frequency temperature characteristics are mutually opposite, and are directly bonded into a ply crystal blank 343 so that the respective crystal axes intersect with the desired angles. The electrodes 344, 345 and 346, 347 are oppositely set across a ply crystal blank 343.

A description of the operation of the crystal filter constructed as described above hereinabove follows.

One of the electrodes 344, and 345 or 346 and 347 is usually grounded. For example, when the electrode 344 is an input terminal, the electrode 346 is an output terminal with electrodes 345 and 347 being grounded; the ply crystal blank 343 is made resonant with a frequency determined by the thickness and the elastic constant if electric signals are inputted to the electrode 344. The resonance is elastically transmitted into the ply crystal blank 343 so as to cause an electric field between the electrodes 346 and 347 so that electric signal is output from the electrode 346. Namely, the filter becomes a band-pass filter of a resonant frequency to be determined by the thickness and elastic constant of the ply crystal blank 343. Since the ply crystal blank 343 is composed using a direct bonding of crystal blanks 341 and 342 so that the frequency temperature characteristics are mutually opposite, the resonant frequency is stable with respect to the temperature.

According to the present embodiment as described hereinabove, two crystal blanks which have the desired cut angle and the desired thickness so as to have mutually opposite frequency-temperature characteristics are directly bonded so that the crystal axes of the respective crystal blanks intersect with the desired angles, and the electrodes are oppositely set across the ply crystal blank, so that a crystal filter which has stable frequency temperature characteristics can be realized.

A twenty ninth embodiment of the present invention will be described hereinafter with reference to the drawings.

Figure 30A:
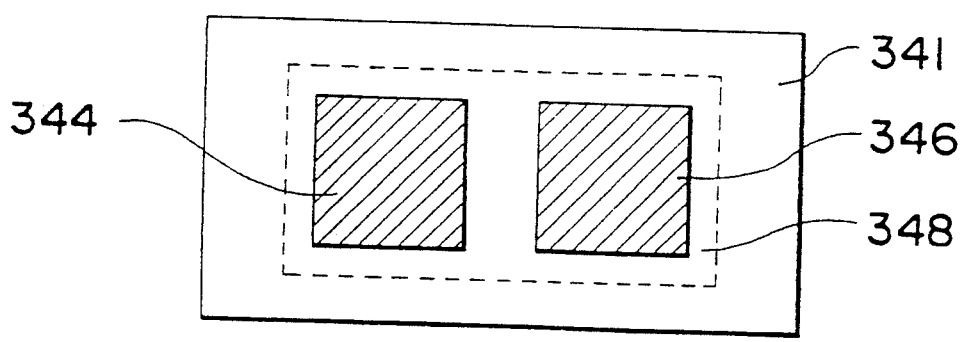
Figure 30B:
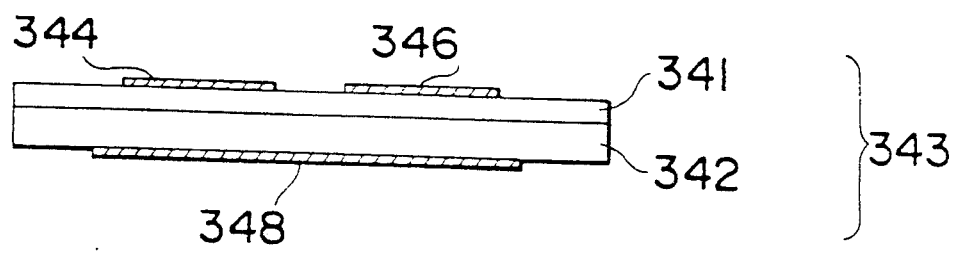

FIGS. 30(a)-30(b) show the construction of a crystal filter in accordance with the twenty ninth embodiment of the present invention, FIG. 30 (a) is a top face view, and FIG. 30 (b) is a side face view.

In FIGS. 30(a)-30(b), element 348 is an electrode. The operation of the present embodiment is the same as in the twenty eighth embodiment shown in FIG. 28. The construction and the assembly are simplified with the electrodes to be grounded being collected in one electrode 348.

A thirtieth embodiment of the present invention will be described hereinafter with reference to the drawings.

Figure 31A:
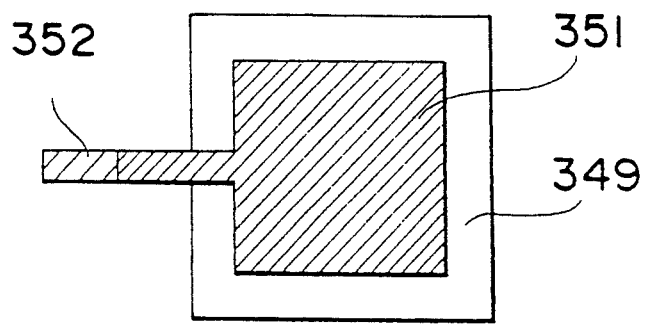
Figure 31B:
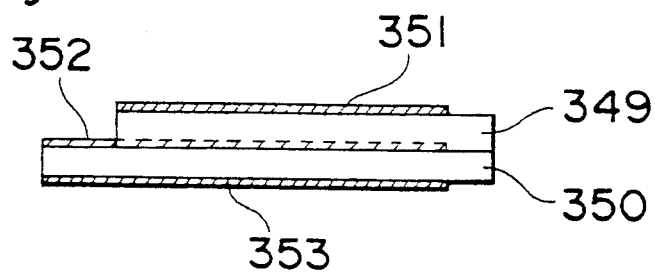

FIGS. 31(a)-31(b) shows the construction of the crystal filter in accordance with the thirtieth embodiment of the present invention, FIG. 31 (a) is a top face view and FIG. 31 (b) is a side face view.

In FIGS. 31(a)-31(b), elements 349 and 350 are crystal blanks and elements 351, 352 and 353 are electrodes. A crystal blank 350 whose both faces have electrodes 352 and 353 formed oppositely on it and a crystal blank 349 whose single face has an electrode 351 formed on it are directly bonded in a portion not provided through an electrode 352 so that the electrodes 351 and 352 may become opposed through the crystal blank 349.

The operation of the crystal filter constructed as described hereinabove will be described hereinafter.

The electrode 352 is usually grounded, so that the electrodes 351 and 353 become electrodes for inputting and outputting electric signals. For example, when electric signals are inputted to the electrode 351, the crystal blank 350 become resonant with frequencies to be determined by the size and elastic constant thereof. Since the crystal blanks 349 and 350 are directly bonded, the resonance is elastically transmitted to the crystal blank 349 so as to cause an electric field between the electrodes 351 and 352 for outputting the electric signals from the electrode 353.

According to the present embodiment as described hereinabove, two crystal resonators with the electrode being grasped are directly bonded, so that the resonance can be constructed in three dimensions so as to realize the small-size crystal filter.

A thirty first embodiment of the present invention will be described hereinafter with reference to the drawings.

Figure 32A:
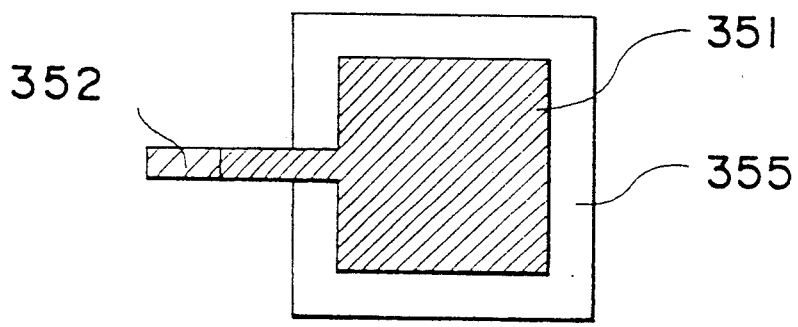
Figure 32B:
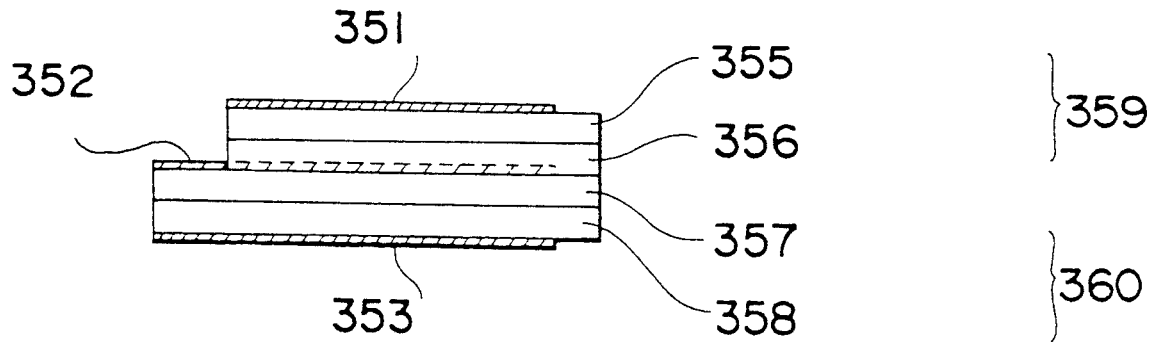

FIGS. 32(a)-32(b) show the construction of the crystal filter in accordance with the thirty first embodiment of the present invention; FIG. 32 (a) is a top face view and FIG. 32 (b) is a side face view.

In FIGS. 32(a)-32(b), elements 355, 356, 357 and 358 are crystal blanks. The crystal blanks 355, 356 and 357, 358 have the desired cut angle and the desired thickness so as to have mutually opposite frequency temperature characteristics, and are directly bonded so that the crystal axes of the respective crystal blanks intersect with desired angles so as to become ply crystal blanks 359 and 360. Although the operation of the present embodiment is similar to the thirtieth embodiment shown in FIGS. 31(a)-31(b), the stable frequency-temperature characteristics can be obtained when the ply crystal blanks 359 and 360, instead of the crystal blanks 349 and 350 in FIGS. 30(a)-30(b), are composed as in the twenty eighth embodiment shown in FIGS. 29(a)-29(b).

In the embodiments of the twenty eighth through the thirty first embodiment, the crystal blank and the electrode are made square in shape. An optional shape such as a circular shape or the like may be used.

In the twenty eighth through thirty first embodiments, no restrictions are given to the number of the crystal blanks, the cut angle, the thickness and the crystal axis relationship in the direct bonding operation.

In the twenty eighth through thirty first embodiments, no restrictions are given to the number, the pattern shape, the composition and the thickness of electrodes.

Although the present invention has been fully described by way of example with reference to the accompanying drawings, it is to be noted here that various changes and modifications will be apparent to those skilled in the art. Therefore, unless otherwise such change and modifications depart from the scope of the present invention, they should be construed as being included therein.

What is claimed is:

1. A method of directly bonding a crystal to a crystal, which includes the steps of mirror-polishing the surfaces, rinsing them with a cleaning materia, thereafter rinsing them with isopropyl alcohol and rinsing them with a mixed sulfuric acid and a hydrogen peroxide solution, effecting a baking operation, bonding together without interpositions crystal blanks which have been processed so that the surfaces thereof are smooth, flat and terminated with a hydroxyl group, bonding the crystal blanks with a bonding force applied between the hydroxyl groups on the surfaces thereof, and thereafter effecting an annealing operation within a temperature range where crystal crystallization is not transited in phase so that a further strong bonding force is obtained.

2. A method of directly bonding a crystal to a crystal, which includes the steps of mirror-polishing the surfaces, rinsing them with a cleaning material, rinsing them with isopropyl alcohol, effecting a baking operation after the drying operation by a drying apparatus using isopropyl alcohol, bonding together without interpositions crystal blanks which have been processed so that the surfaces thereof are smooth, flat and terminated with a hydroxyl group, bonding the crystal blanks with a bonding force applied between the hydroxyl groups on the surfaces thereof, and thereafter effecting an annealing operation within a temperature range where crystal crystallization is not transited in phase so that a further strong bonding strength is obtained.

3. A method of direct bonding a crystal to a crystal, which includes the steps of mirror-polishing the surfaces, rinsing them with a cleaning material, thereafter rinsing them with isopropyl alcohol, and rinsing them with hydrogen solution fluoride or ammonium solution fluoride, effecting a baking operation, bonding together without interpositions crystal blanks which have been processed so that the surfaces thereof are smooth, flat and terminated with a hydroxyl group, bonding the crystal blanks with a bonding force applied between the hydroxyl groups on the surfaces thereof, and thereafter effecting an annealing operation within a temperature range where crystal crystallization is not transited in phase so that a further strong bonding strength is obtained.

4. A crystal resonator where electrodes are oppositely established across a ply crystal blank with at least two sheets of crystal blanks having a desired cut angle and a desired thickness being directly bonded so that the respective crystal axes intersect at the desired angles.

5. A crystal resonator where electrodes are oppositely established across a thinner central portion region of a ply crystal blank with at least two sheets of crystal blanks having a desired cut angle and a desired thickness being directly bonded so that the respective crystal axes intersect at the desired angles so as to constitute a ply crystal blank whose central portion is thicker than a surrounding portion.

6. A crystal resonator where electrodes are oppositely established across a thinner central portion region of a ply crystal blank with at least two sheets of crystal blanks having a desired cut angle and a desired thickness being directly bonded so that the respective crystal axes intersect at the desired angles so as to constitute a ply crystal blank whose central portion is thinner than a surrounding portion.

7. A crystal resonator where at least two sets of electrodes are oppositely established respectively across a desired thickness of a crystal blank with at least two sheets of crystal blanks having the desired cut angle and the desired thickness being directly bonded so that the respective crystal axes intersect with the desired angles so as to constitute a ply crystal blank having at least two different thicknesses.

8. A crystal resonator where at least two sets of electrodes are oppositely established across a ply crystal blank with at least two sheets of crystal blanks having a desired cut angle and a desired thickness being directly bonded so that the respective crystal axes intersect with the desired angles, and that a third region whose thickness is different from either of the first and second regions is provided between the first region where a first electrode pair is provided and the second region where a second electrode pair is provided.

9. A crystal oscillator including a crystal resonator where electrodes are oppositely established through a ply crystal blank with at least two sheets of crystal blanks having a desired cut angle and a desired thickness being directly bonded so that the respective crystal axes intersect with the desired angles.

10. A analog temperature compensated crystal oscillator provided with a crystal resonator, a temperature compensating circuit composed of a temperature sensing element, a resistor and a capacity element, the crystal resonator with electrodes being oppositely established across a ply crystal blank with at least two sheets of crystal blanks having a desired cut angle and a desired thickness being directly bonded so that the respective crystal axes intersect with the desired angles.

11. A digital temperature compensated crystal oscillator comprising a crystal resonator, a digitally controlled crystal oscillator composed of a digitally controlled variable reactance circuit and an oscillator circuit, a temperature sensor, an A/D convertor for converting the output signals of the temperature sensor into digital signals, a memory for storing the data corresponding to the digital signals of the A/D convertor and for outputting the data to the variable reactance circuit, the crystal resonator with electrodes being oppositely established across a ply crystal blank where at least two sheets of crystal blanks having the desired cut angle and the desired thickness are directly bonded so that the respective crystal axes intersect with the desired angles.

12. A digital temperature compensated crystal oscillator comprising a crystal oscillator, a temperature sensor, an A/D convertor for converting the output signals of the temperature sensor into digital signals, a memory for storing the data corresponding to the digital signals of the A/D convertor, a programmable frequency divider for dividing the output frequency of the crystal oscillator in accordance with the described data of the above memory, the crystal oscillator using a crystal resonator with electrodes being oppositely established across a ply crystal blank where at least two sheets of crystal blanks having the desired cut angle and the desired thickness are directly bonded so that the respective crystal axes intersect with the desired angles.

13. A digital temperature compensated crystal oscillator comprising, a digitally controlled crystal oscillator composed of a digitally controlled variable reactance circuit a first oscillation circuit and a first vibrating portion, a temperature sensor composed of a second vibrating portion and a second oscillation circuit, an A/D convertor for converting the output signals of the temperature sensor into digital signals, a memory for storing the data corresponding to the digital signals of the A/D convertor so as to output the temperature sensor into digital signals, a memory for storing the data corresponding to the digital signals of the A/D convertor so as to output the data to the variable reactance circuit, with at least two crystal blanks having the desired cut angle and the desired thickness being directly bonded so that the respective bonding axes intersect at the desired angles so as to construct a ply crystal blank having at least two different thicknesses, and two sets of electrodes being oppositely established across the desired thickness of the ply crystal blank so as to integrate the first and second vibrating portions.

14. A digital temperature compensated crystal oscillator comprising a first crystal oscillator using a first vibrating portion, a temperature sensor using a second vibrating portion, A/D convertor for converting the output signals of the temperature sensor into the digital signals, a memory for storing the data corresponding to the digital signals of the A/D convertor, a programmable frequency divider for dividing the output frequency of the frequency oscillator in accordance with the data of the memory, with at least two sheets of crystal blanks having the desired cut angle and the desired thickness being directly bonded so that the respective bonding axes intersect at the desired angles so as to construct a ply crystal blank having at least two different thicknesses, and two set of electrodes being oppositely established across the desired thickness of the ply crystal blanks so as to integrate the first and second vibrating portions.

15. A crystal filter where at least two sets of opposite electrodes are formed a ply crystal blank with at least two sheets of crystal blanks having a desired cut angle and a desired shape being directly bonded so that respective crystal axes intersect at desired angles.

16. A crystal filter where a crystal blank having electrodes formed on both faces thereof, and at least one sheet of crystal blank with an electrode formed on a single face thereof are superposed so that the crystal blanks and the electrodes alternate, the respective crystal blanks being directly bonded in a portion where an electrode is not interposed.

17. A crystal filter described in accordance with claim 16, where a ply crystal blank is used with at least two sheets of crystal blanks having the desired cut angle and the desired thickness as a crystal blank being directly bonded so that the respective crystal axes intersect at desired angles.

* * * * *

UNITED STATES PATENT AND TRADEMARK OFFICE
CERTIFICATE OF CORRECTION

PATENT NO. : 5,319,324
DATED : June 7, 1994
INVENTOR(S) : Yuki SATOH et al.

It is certified that error appears in the above-indentified patent and that said Letters Patent is hereby corrected as shown below:

On the title page, under item [30], after third priority no., insert
--Feb. 19, 1992 [JP] Japan .......... 4-31669--

Signed and Sealed this

Fourth Day of October, 1994

Attest:

Attesting Officer

BRUCE LEHMAN

Commissioner of Patents and Trademarks